(12) United States Patent
Landesberger et al.

(10) Patent No.: US 11,901,285 B2
(45) Date of Patent: Feb. 13, 2024

(54) MICROELECTRONIC ARRANGEMENT AND METHOD FOR MANUFACTURING THE SAME

(71) Applicant: Fraunhofer-Gesellschaft zur Förderung der angewandten Forschung e.V., Munich (DE)

(72) Inventors: Christof Landesberger, Munich (DE); Christoph Kutter, Munich (DE); Peter Ramm, Munich (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 108 days.

(21) Appl. No.: 17/326,084

(22) Filed: May 20, 2021

(65) Prior Publication Data

US 2021/0375754 A1 Dec. 2, 2021

(30) Foreign Application Priority Data

May 29, 2020 (DE) .......................... 102020206769.4

(51) Int. Cl.
*H01L 21/00* (2006.01)
*H01L 23/522* (2006.01)
(Continued)

(52) U.S. Cl.
CPC .......... *H01L 23/5226* (2013.01); *H01L 21/50* (2013.01); *H01L 23/14* (2013.01);
(Continued)

(58) Field of Classification Search
CPC ...... H01L 23/5226; H01L 21/50; H01L 23/14
See application file for complete search history.

(56) References Cited

U.S. PATENT DOCUMENTS 7,011,989 B2 * 3/2006 Becker ................. H01L 21/568
257/E25.023
8,072,768 B2 * 12/2011 Ockenfuss ............ H05K 1/185
361/795
(Continued)

FOREIGN PATENT DOCUMENTS

CN 113745120 A * 12/2021 ............. H01L 21/50
DE 19520700 B4 * 9/2004 ........... H05K 1/0231
(Continued)

*Primary Examiner* — Laura M Menz
(74) *Attorney, Agent, or Firm* — Perkins Coie LLP; Michael A. Glenn

(57) ABSTRACT

Embodiments provide a method for manufacturing a microelectronic arrangement. The method includes a step of providing a chip-film module with a semiconductor chip and a film substrate having arranged thereon the semiconductor chip, wherein the chip-film module includes at least one coupling element spaced apart from the semiconductor chip and electrically coupled to at least one terminal of the semiconductor chip. Furthermore, the method includes a step of embedding the chip-film module into a printed circuit board, wherein, in embedding the chip-film module into the printed circuit board, the at least one coupling element of the chip-film module is coupled vertically [e.g. in the vertical direction [e.g. in relation to the printed circuit board]] [e.g. perpendicular to a surface of the printed circuit board] to at least one coupling counter element of the printed circuit board.

23 Claims, 21 Drawing Sheets

(51) Int. Cl.
  *H01L 21/50*   (2006.01)
  *H01L 23/14*   (2006.01)
  *H01L 23/528*  (2006.01)
  *H05K 1/11*    (2006.01)
  *H05K 3/32*    (2006.01)

(52) U.S. Cl.
  CPC ............ *H01L 23/528* (2013.01); *H05K 1/11* (2013.01); *H05K 3/32* (2013.01)

(56) References Cited

U.S. PATENT DOCUMENTS

| | | | |
|---|---|---|---|
| 9,392,698 B2 | 7/2016 | Hong et al. | |
| 9,927,316 B2* | 3/2018 | Kuehne | G01L 9/005 |
| 10,490,473 B2 | 11/2019 | Huang et al. | |
| 10,752,499 B2* | 8/2020 | Landesberger | B81B 7/007 |
| 10,855,051 B2* | 12/2020 | Möhrle | H01S 5/02375 |
| 11,452,199 B2* | 9/2022 | Schrems | H05K 1/0201 |
| 2003/0137045 A1 | 7/2003 | Sugaya et al. | |
| 2004/0158980 A1 | 8/2004 | Nakatani et al. | |
| 2004/0178484 A1* | 9/2004 | Burdick, Jr. | H01L 23/36 |
| | | | 257/E23.101 |
| 2005/0161823 A1 | 7/2005 | Jobetto et al. | |
| 2008/0076209 A1 | 3/2008 | Klink et al. | |
| 2008/0224298 A1* | 9/2008 | Corisis | H01L 25/105 |
| | | | 257/E23.06 |
| 2008/0308917 A1 | 12/2008 | Pressel et al. | |
| 2016/0173001 A1* | 6/2016 | Langa | B81B 3/0021 |
| | | | 438/22 |
| 2017/0185107 A1 | 6/2017 | Kwon | |
| 2017/0345763 A1 | 11/2017 | Cheah et al. | |
| 2018/0035548 A1* | 2/2018 | Landesberger | H01L 33/483 |
| 2018/0199438 A1 | 7/2018 | Tuominen | |
| 2018/0211899 A1* | 7/2018 | Morianz | H01L 24/20 |
| 2018/0219350 A1* | 8/2018 | Möhrle | H01S 5/12 |
| 2019/0135618 A1* | 5/2019 | Landesberger | H01L 24/83 |
| 2019/0206837 A1 | 7/2019 | Kurita | |
| 2019/0237373 A1* | 8/2019 | Huang | H05K 1/185 |
| 2020/0163203 A1 | 5/2020 | Park | |
| 2020/0279797 A1* | 9/2020 | Faul | H01L 23/49572 |
| 2021/0084747 A1* | 3/2021 | Schrems | H05K 1/18 |
| 2021/0176864 A1* | 6/2021 | Landesberger | H01L 23/5387 |
| 2021/0375754 A1* | 12/2021 | Landesberger | H01L 25/167 |

FOREIGN PATENT DOCUMENTS

| | | | | |
|---|---|---|---|---|
| DE | 102006044525 B3 | | 1/2008 | |
| DE | 102008025223 A1 | | 12/2008 | |
| DE | 102017208435 A1 | | 11/2018 | |
| DE | 102019202717 A1 | * | 9/2020 | |
| DE | 102020206769 B3 | * | 6/2021 | ............ H01L 21/50 |
| EP | 3355349 A1 | | 8/2018 | |
| EP | 3916780 A2 | * | 12/2021 | ............ H01L 21/50 |
| EP | 3916780 A3 | * | 7/2022 | ............ H01L 21/50 |
| JP | 2010239344 A | * | 10/2010 | ............ H01L 24/19 |
| TW | 200640302 A | | 11/2006 | |
| TW | 201622081 A | | 6/2016 | |
| TW | 201724411 A | | 7/2017 | |
| TW | I658547 B | | 5/2019 | |
| TW | I677062 B | | 11/2019 | |
| TW | 202213546 A | * | 4/2022 | ............ H01L 21/50 |
| WO | 2016110362 A1 | | 7/2016 | |

* cited by examiner

100

┌─────────────────────────────────────────────────┐
│ Providing a chip-film module with a semiconductor chip │
│ and a film substrate having arranged thereon     │
│ the semiconductor chip, wherein the chip-film module │ — 102
│ comprises at least one coupling element          │
│ spaced apart from the semiconductor chip and     │
│ being electrically coupled to at least one terminal │
│ of the semiconductor chip                        │
└─────────────────────────────────────────────────┘
                        ↓
┌─────────────────────────────────────────────────┐
│ Embedding the chip-film module into a printed circuit board, │
│ wherein, in embedding the chip-film module into  │
│ the printed circuit board, the at least one coupling element │ — 104
│ of the chip-film module is vertically coupled to at least │
│ one coupling counter element of the printed circuit board │
└─────────────────────────────────────────────────┘
                        ↓

Fig. 1

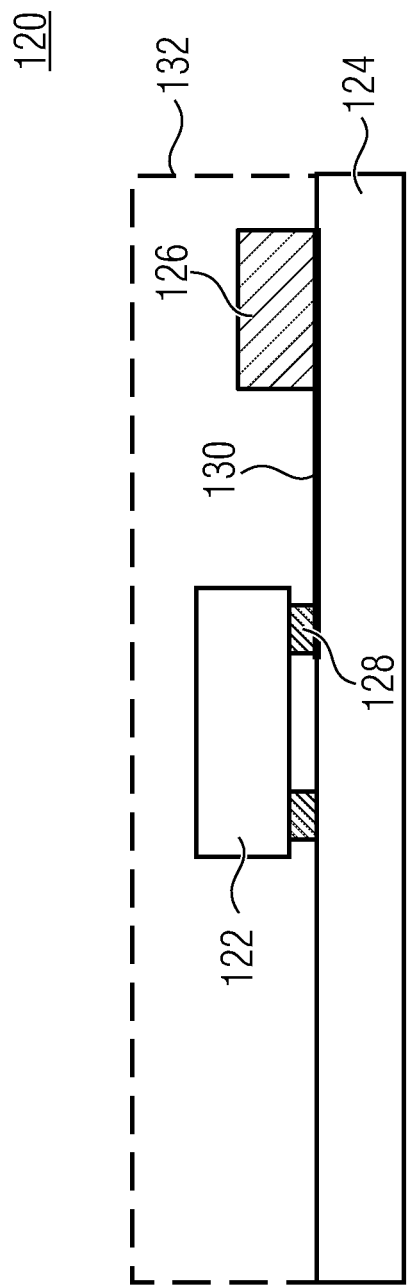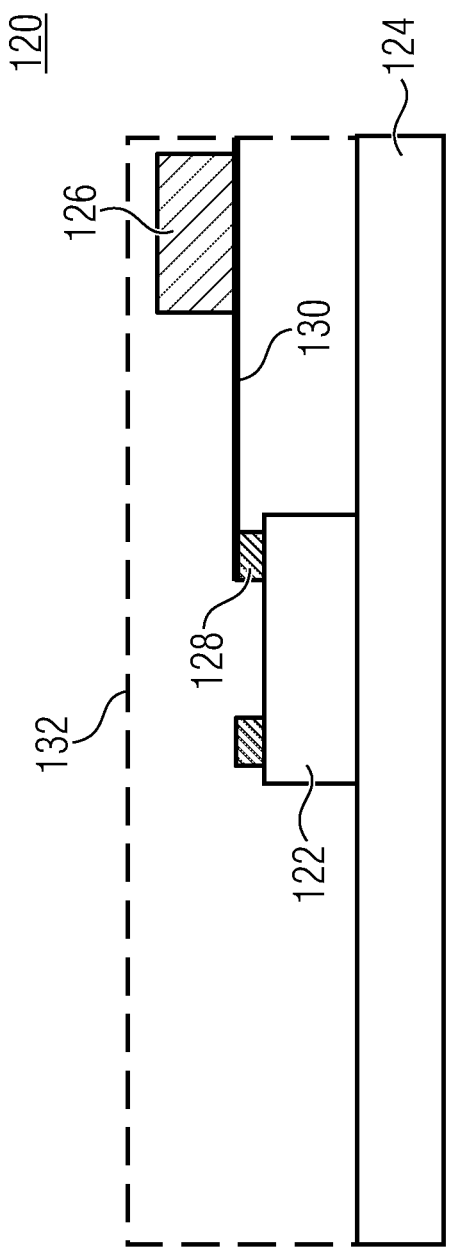

MICROELECTRONIC ARRANGEMENT AND METHOD FOR MANUFACTURING THE SAME

CROSS-REFERENCE TO RELATED APPLICATION

This application claims priority from German Patent Application No. DE 10 2020 206 769.4, which was filed on May 29, 2020, and is incorporated herein in its entirety by reference.

BACKGROUND OF THE INVENTION

Embodiments concern a method for manufacturing a microelectronic arrangement, and in particular a microelectronic arrangement with a chip-film module (e.g. a chip-film interposer). Further embodiments concern such a microelectronic arrangement. Some embodiments concern a modular integration of chip-film interposers.

It is a basic goal of microelectronics to manufacture the functional components in an always smaller, thinner, and lighter manner and to therefore enable an increasing use for portable electronic devices (e.g. smartphones, laptops, smart watches, body sensor systems), or to improve the computing speed or memory capacity with a volume reduction of the integrated system.

A multitude of different three-dimensional integration techniques is known. They are often based on the utilization of conductive contacts (e.g. through-silicon vias, TSV) that pass perpendicularly through the wafer substrate. The semiconductor wafer itself (e.g. with the IC elements (IC=integrated circuit)) may be the substrate, or an additional so-called interposer wafer made of silicon or glass may be the substrate. Interposer here refers to an electric routing interface from a terminal pad or a connection to another terminal pad or another connection. For example, the purpose of an interposer is to route a terminal pad to a larger terminal pad, or to redirect a connection to another connection. In the case of silicon substrates, the conductive through via (or through connection) is insulated against the surrounding substrate. The technology for manufacturing these through vias on wafer substrates is elaborate and can only be performed in special semiconductor factories. In the case of glass interposers, the requirement of the insulation is omitted. However, the elaborate process sequence remains; in addition, the very thin glass-interposer wafers are very prone to breakage.

A further disadvantage of the so-called wafer-to-wafer integration techniques is the loss of yield in a three-dimensional stack, since, all chip components are generally contacted on a wafer, even those that are not electrically functional.

An alternative for this is the so-called chip-to-wafer integration, in which already tested integrated circuits (ICs) are preselected. Substrates in chip-to-wafer configuration have a large topography. This leads to the disadvantage of the requirement of an elaborate planarization in each plane.

For example, a method for manufacturing a chip-film interposer is known from DE 10 2017 208 435 A1.

In addition, so-called embedding technologies are known, where unhoused semiconductor components (e.g. integrated circuits, ICs) are embedded into a printed circuit board and are electrically contacted with techniques of the printed circuit board technology. There is a large obstacle: the surface areas of the contact pads on the chip are so small that they practically cannot be contacted and wired selectively and with the required high yield using the structuring techniques of the PCB (printed circuit board) industry. Thus, conventionally, a redistribution is first realized on the semiconductor wafers (e.g. by means of a redistribution layer (RDL)), with the purpose to distribute the very small contact pads that are usually located at the edge of a chip layout in an additional upper metallization plane across the entire chip surface area and to additionally expand the pad surface area to a size of more than 200 µm×200 µm. In addition, these redistributed contact areas have to be provided with a stable metallization layer, e.g. nickel or gold, with a thickness of a few micrometers, since a laser is later used in the manufacturing of through vias in the semiconductor factory so as to open a contact hole down to the chip contact. Typically, the laser generates a hole with a diameter of more than 100 µm in the printed circuit board material (i.e. larger than the original small contact pads on the integrated circuit (IC)) and also damages the metal surface on the contact pad. Thus, the contact pad has to become larger (by the redistribution) and more stable against the laser emission (therefore the addition of a Ni/Au coating). Both processes are elaborate and high in costs. A further problem is the handling of unhoused chips in the printed circuit board factory; typically, at these locations there are no machines for processing very small semiconductor elements that are prone to breakage.

The integration of housed components (e.g. silicon chips and so-called mold packages with a thickness of approx. 1 mm) into a printed circuit board does not make sense, since the printed circuit board would become even thicker and the geometrical freedom in the implementation of the wiring (layout) would be limited; thus, there is no advantage in the sense of a greater integration density or a smaller structural shape.

In addition, multilayered printed circuit boards comprising in each plane a lamination layer (e.g. "prepreg": an epoxy layer with a copper coating) are known. Conventionally, the copper layers are structured in a wet-chemical manner so as to create conductor paths. In this case, lithographical masks or a digital direct lithography of a photoresist is utilized.

SUMMARY

An embodiment may have a method for manufacturing a microelectronic arrangement, including providing a chip-film module with a semiconductor chip and a film substrate having arranged thereon the semiconductor chip, wherein the chip-film module includes at least one coupling element spaced apart from the semiconductor chip and electrically coupled to at least one terminal of the semiconductor chip, and embedding the chip-film module into a printed circuit board, wherein, in embedding the chip-film module into the printed circuit board, the at least one coupling element of the chip-film module is coupled vertically to at least one coupling counter element of the printed circuit board.

Another embodiment may have a microelectronic arrangement, including: a printed circuit board, and a chip-film module, wherein the chip-film module includes a semiconductor chip and a film substrate having arranged thereon the semiconductor chip, wherein the chip-film module includes at least one coupling element spaced apart from the semiconductor chip and electrically coupled to the at least one terminal of the semiconductor chip, wherein the chip-film module is embedded into the printed circuit board, wherein the at least one coupling element of the chip-film module is coupled vertically to at least one coupling counter element of the printed circuit board.

Another embodiment may have a chip-film module, including: a film substrate, a semiconductor chip arranged on the film substrate, at least one coupling element spaced apart from the semiconductor chip and arranged on or in the film substrate, wherein the at least one coupling element is electrically coupled to at least one terminal of the semiconductor chip via at least one conductor path formed on or in the film substrate, wherein the at least one coupling element is configured to be coupled to at least one external counter coupling element, wherein the chip-film module includes an embedding layer arranged on the film substrate, wherein the embedding layer fully embeds the semiconductor chip and the at least one coupling element, wherein the at least one coupling element is an electric terminal.

Another embodiment may have a chip-film module, including: a film substrate, a semiconductor chip arranged on the film substrate, at least one coupling element spaced apart from the semiconductor chip and arranged on or in the film substrate, wherein the at least one coupling element is electrically coupled to at least one terminal of the semiconductor chip via at least one conductor path formed on or in the film substrate, wherein the at least one coupling element is configured to be coupled to at least one external counter coupling element, wherein the chip-film module includes an embedding layer arranged on the film substrate, wherein the embedding layer fully embeds the semiconductor chip and the at least one coupling element, wherein the at least one coupling element is an optical coupling element.

Another embodiment may have a chip-film module, including: a film substrate, a semiconductor chip arranged on the film substrate, at least two coupling elements spaced apart from the semiconductor chip, wherein the film substrate includes at least two terminal elements connected to at least two terminals of the semiconductor chip via at least two conductor paths formed in or on the film substrate, wherein the chip-film module includes at least two embedding layers located above one another or in a stacked manner, embedding the semiconductor chip and/or the film substrate, wherein the at least two coupling elements are arranged in or on different embedding layers of the at least two embedding layers, wherein the at least two coupling elements are connected to the at least two terminal elements of the film substrate via vertical electric connections, wherein the at least two coupling elements are configured to be coupled to at least two external counter coupling elements.

Another embodiment may have a microelectronic arrangement, including: a printed circuit board, and a chip-film module according to the invention, wherein the chip-module is embedded into the printed circuit board, wherein the at least one coupling element of the chip-film module is coupled vertically to at least one coupling counter element of the printed circuit board.

Embodiments provide a method for manufacturing a microelectronic arrangement. The method includes a step of providing a chip-film module [e.g. a film interposer] with a semiconductor chip and a film substrate having arranged thereon the semiconductor chip, wherein the chip-film module comprises at least one coupling element spaced apart from the semiconductor chip and electrically coupled to at least one terminal of the semiconductor chip. Furthermore, the method includes a step of embedding the chip-film module into a printed circuit board, wherein, in embedding the chip-film module into the printed circuit board, the at least one coupling element of the chip-film module is coupled vertically [e.g. in the vertical direction [e.g. in relation to the printed circuit board]] [e.g. perpendicular to a surface of the printed circuit board] to at least one coupling counter element of the printed circuit board.

The present invention is based on the idea to first integrate a (thin) semiconductor chip (e.g. a semiconductor component) into a thin, film-based module (e.g. a package) and to then permanently integrate this chip-film module (e.g. the film interposer) in a printed circuit board and to realize the respective (e.g. electrical, optical, capacitive, inductive, electromagnetic) connections.

In embodiments, it is essentially the function of the chip-film module (e.g. the chip-film package or film interposer) to expand the very small geometries of the contact pads on the semiconductor chip (e.g. the surface area of the pads is currently approx. 60 µm×60 µm; the distance of the pads: 20-60 µm) through contacting and redistribution (re-wiring) on the thin film carrier to a measurement that is compatible with the typical geometries of a standard printed circuit board production. That is, the pad size and pad distances of the external contacts on the chip-film module may then be larger than 100 µm, preparable larger than 200 µm.

In embodiments, the (thin) chip-film module (e.g. the film interposer) with an integrated semiconductor chip (e.g. a semiconductor component) may then be inserted into an inner position of a printed circuit board and may be permanently connected. One or several of such embedded chip-film modules may be contained in a printed circuit board component, the chip-film modules may also be integrated as a three-dimensional stack into the printed circuit board.

In embodiments, at least one coupling element of the at least one coupling element of the chip-film module is an electric terminal (electric connector), wherein at least one coupling counter element of the at least coupling counter element of the printed circuit board is a through via (through contacting).

In embodiments, a terminal area of the terminal of the chip-film module is larger than a terminal area of the terminal of the semiconductor chip [e.g. at least by the factor 1.5 or 2], and/or wherein distances between terminals of the chip-film module are larger than distances between terminals of the semiconductor chip [e.g. at least by the factor 1.5 or 2].

In embodiments, at least one coupling element of the at least one coupling element of the chip-film module is an optical coupling element [e.g. an LED, a photodiode or a photodetector], wherein at least one coupling counter element of the at least one coupling counter element of the printed circuit board is an optical coupling counter element [e.g. a photodetector, a photodiode, or an LED].

In embodiments, at least one coupling element of the at least one coupling element of the chip-film module is an inductive or capacitive coupling element [e.g. a coil/a conductor loop, or capacitor plate], wherein at least one coupling counter element of the at least one coupling counter element of the printed circuit board is an inductive or capacitive coupling counter element [e.g. a coil/a conductor loop, or a capacitor plate].

In embodiments, the semiconductor chip is [e.g. fully] embedded into the chip-film module [e.g. by an embedding layer and the film substrate].

In embodiments, the at least one coupling element is arranged on or in the film substrate and is connected to the at least one terminal of the semiconductor chip via at least one conductor path formed on or in the film substrate.

In embodiments, the semiconductor chip is arranged on the film substrate such that the at least one terminal of the semiconductor chip faces away from the film substrate, wherein the at least one coupling element is arranged in or on an embedding layer of the chip-film module in which the semiconductor chip is embedded, wherein the at least one coupling element is connected to the at least one terminal of the semiconductor chip via a vertical electric connection.

In embodiments, the film substrate comprises at least two terminal elements connected to at least two terminals of the semiconductor chip via at least two conductor paths formed in or on the film substrate, wherein the chip-film module comprises at least two embedding layers located above one another or in a stacked manner, embedding the semiconductor chip and/or the film substrate, wherein the chip-film module comprises at least two coupling elements arranged in or on different embedding layers of the at least two embedding layers, wherein the at least two coupling elements are connected to the at least two terminal elements of the film substrate via vertical electric connections.

In embodiments, the printed circuit board comprises at least two lamination planes in which the chip-film module is [e.g. fully] embedded.

In embodiments, the semiconductor chip is connected to at least one circuit component of the printed circuit board via the at least one coupling element of the chip-film module and the at least one coupling counter element of the printed circuit board.

In embodiments, the step of providing the chip-film module comprises:
providing the semiconductor chip
providing the film substrate,
connecting the semiconductor chip to the film substrate.

In embodiments, the step of providing the chip-film module further comprises:
embedding the semiconductor chip into an embedding layer.

In embodiments, the step of embedding the chip-film module into the printed circuit board comprises:
providing at least one lamination plane of the printed circuit board,
arranging the chip-film module on the at least one lamination plane of the printed circuit board or within the at least one lamination plane of the printed circuit board,
providing at least one further lamination plane of the printed circuit board on and/or under the at least lamination plane of the printed circuit board so that the chip-film module is embedded into the printed circuit board.

In embodiments, the film substrate comprises at least two coupling elements spaced apart from the semiconductor chip and connected to at least two terminals of the semiconductor chip via two conductor paths formed in or on the film substrate, wherein the at least two coupling elements are electric terminals, wherein conductor paths of the printed circuit board are connected to the terminals of the film substrate via at least two through vias as counter coupling elements.

In embodiments, the semiconductor chip is embedded into the chip-film module in an embedding layer arranged on the film substrate.

In embodiments, the at least two through vias extend vertically through the film substrate or through the embedding layer to the at least two terminals of the film substrate.

In embodiments, starting from a first plane of the printed circuit board, a first through via of the at least two through vias extends vertically through the film substrate to a first terminal of the at least two terminals of the film substrate, and/or wherein, starting from a second plane of the printed circuit board, a second through via of the at least two through vias extends vertically through the embedding layer of the chip-film module to a second one of the at least two terminals of the film substrate.

In embodiments, the at least one coupling element is arranged on or in the film substrate and is connected to the at least one terminal of the semiconductor chip via at least one conductor path formed on or in the film substrate, wherein at least one coupling element of the at least one coupling element of the film interface substrate is an optical coupling element, wherein at least one coupling counter element of the at least one coupling counter element of the printed circuit board is an optical coupling counter element, wherein the optical coupling element and the optical counter coupling element are optically coupled to each other in a vertical direction.

In embodiments, at least one further coupling element of the at least one coupling element is arranged on or in the film substrate and is connected to at least one further terminal of the semiconductor chip via at least one further conductor path formed on or in the film substrate, wherein the at least one further coupling element is an inductive or a capacitive coupling element, wherein at least one further coupling counter element of the at least one coupling counter element of the printed circuit board is an inductive or a capacitive coupling counter element, wherein the inductive or capacitive coupling element and the inductive or capacitive coupling counter element are inductively or capacitively coupled to each other in the vertical direction.

In embodiments, the chip-film module comprises at least two coupling elements, wherein the semiconductor chip comprises at least two terminals, wherein the semiconductor chip is arranged on the film substrate such that the at least two terminals of the semiconductor chip face away from the film substrate, wherein the at least two coupling elements are arranged in or on an embedding layer of the chip-film module in which the semiconductor chip is embedded, wherein the at least two coupling elements are connected to the at least two terminals of the semiconductor chip via vertical electric connections, wherein the at least two coupling elements are electric terminals, wherein conductor paths of the printed circuit board are connected to the at least two terminals of the chip-film module via at least two through vias as counter coupling elements.

In embodiments, the film substrate is a thermally conductive film substrate, wherein the printed circuit board comprises thermal through vias neighboring the thermally conductive film substrate, configured to conduct thermal energy from the thermally conductive film substrate to a surrounding area of the printed circuit board.

In embodiments, the film substrate comprises two terminal elements connected to at least two terminals of the semiconductor chip via at least two conductor paths formed in or on the film substrate, wherein the chip-film module comprises two embedding layers located above one another or in a stacked manner, embedding the semiconductor chip and/or the film substrate, wherein the chip-film module comprises at least two coupling elements arranged in or on different embedding layers of the at least two embedding layers, wherein the at least two coupling elements are connected to the at least two terminal elements of the film substrate via vertical electric connections, wherein the at least two coupling elements are electric terminals, wherein the conductor paths of the printed circuit board are connected to the at least two terminals of the chip-film module via at least two through vias as counter coupling elements, wherein, starting from a first plane of the printed circuit board, a first through via of the at least two through vias extends vertically to a first terminal of the at least two terminals of the chip-film module, wherein, starting from a second plane of the printed circuit board, a second through via of the at least two through vias extends vertically to a second of the at least two terminals of the film substrate.

In embodiments, the method comprises a step of providing a further chip-film module [e.g. a film interposer] with a further semiconductor chip and a further film substrate having arranged thereon the further semiconductor chip, wherein the further chip-film module comprises at least one coupling element spaced apart from the further semiconductor chip and coupled to at least one terminal of the further semiconductor chip, and wherein the method comprises a step of embedding the further chip-film module into the printed circuit board, wherein, in embedding the further chip-film module into the printed circuit board, the at least one coupling element of the further chip-film module is vertically coupled to the at least one further coupling counter element of the printed circuit board, wherein the chip-film module and the further chip-film module are stacked in a vertical direction of the printed circuit board.

In embodiments, the printed circuit board comprises at least two conductor path planes, wherein the chip-film module is arranged between the at least two conductor path planes, wherein, in embedding the chip-film module into the printed circuit board, a vertical through via is formed through the chip-film module for connecting conductor paths of the at least two conductor path planes.

Further embodiments provide a microelectronic arrangement with a printed circuit board and a chip-film module, wherein the chip-film module comprises a semiconductor chip and a film substrate having arranged thereon the semiconductor chip, wherein the chip-film module comprises at least one coupling element spaced apart from the semiconductor chip and electrically coupled to the at least one terminal of the semiconductor chip, wherein the chip-film module is [e.g. fully] embedded into the printed circuit board, wherein the at least one coupling element of the chip-film module is coupled vertically [e.g. in a vertical direction [e.g. in relation to the printed circuit board]] [e.g. perpendicular to a surface of the printed circuit board] to at least one coupling counter element of the printed circuit board.

Further embodiments provide a chip-film module with a film substrate, a semiconductor chip arranged on the film substrate, and at least one coupling element spaced apart from the semiconductor chip and arranged on or in the film substrate, wherein the at least one coupling element is electrically coupled to at least one terminal of the semiconductor chip via at least one conductor path formed on or in the film substrate, wherein the at least one coupling element is configured to be coupled to at least one external counter coupling element, wherein the chip-film module comprises an embedding layer arranged on the film substrate, wherein the embedding layer fully embeds the semiconductor chip and the at least one coupling element, wherein the at least one coupling element is an electric terminal [e.g. an electric terminal area [e.g. a pad]].

Further embodiments provide a chip-film module with a film substrate, a semiconductor chip arranged on the film substrate, and at least one coupling element spaced apart from the semiconductor chip and arranged on or in the film substrate, wherein the at least one coupling element is electrically coupled to at least one terminal of the semiconductor chip via at least one conductor path formed on or in the film substrate, wherein the at least one coupling element is configured to be coupled to at least one external counter coupling element, wherein the chip-film module comprises an embedding layer arranged on the film substrate, wherein the embedding layer fully embeds the semiconductor chip and the at least one coupling element, wherein the at least one coupling element is an optical coupling element.

Further embodiments provide a chip-film module with a film substrate, a semiconductor chip arranged on the film substrate, at least two coupling elements spaced apart from the semiconductor chip, wherein the film substrate comprises at least two terminal elements connected to at least two terminals of the semiconductor chip via at least two conductor paths formed in or on the film substrate, wherein the chip-film module comprises at least two embedding layers located above one another or in a stacked manner, embedding the semiconductor chip and/or the film substrate, wherein the at least two coupling elements are arranged in or on different embedding layers of the at least two embedding layers, wherein the at least two coupling elements are connected to the at least two terminal elements of the film substrate via vertical electric connections, wherein the at least two coupling elements are configured to be coupled to at least two external counter coupling elements.

Further embodiments provide a microelectronic arrangement with a printed circuit board and a chip-film module according to any of the embodiments described herein, wherein the chip-module is [e.g. fully] embedded into the printed circuit board, wherein the at least one coupling element of the chip-film module is coupled vertically [e.g. in the vertical direction [e.g. in relation to the printed circuit board]] [e.g. perpendicular to a surface of the printed circuit board] to at least one coupling counter element of the printed circuit board.

Further embodiments provide a method for manufacturing three-dimensional electronic systems, and in particular three-dimensional integrated circuits. A three-dimensional integration is understood to be the (mechanical and electrical) vertical connection of components. The advantages of a three-dimensional integrated electronic system are, among other things, the higher package densities and switching speeds [caused by shorter conduction distances] that may be achieved in contrast to two-dimensional systems (planar technique).

Further embodiments provide a multilayered circuit carrier comprising in its interior or on its surface a film interposer, characterized in that conductor path structures are implemented on the film interposer, comprising an electric (galvanically coupled) or electro-magnetic or optical coupling between the conductor path structures of the circuit carrier and the conductive structures of the film interposer.

Further embodiments provide a multilayered circuit carrier comprising in its interior or on its surface a film interposer, characterized in that at least one electrically functional component, e.g. a IC component (IC=integrated circuit), is mounted on the film interposer.

Further embodiments provide a multilayered circuit carrier comprising in its interior or on its surface a film interposer, characterized in that at least one electrically functional component, e.g. a IC component (IC=integrated circuit), is arranged on the film interposer, wherein the semiconductor component is electrically connected to the conductor paths of the circuit carrier.

Further embodiments provide a film interposer in a circuit carrier comprising a contact hole (through via) through the film interposer, wherein there is no electric contact to the conductor path structures of the film interposer, however, the through via can be used for the wiring on the circuit carrier.

Further embodiments provide an interposer on the basis of a thermally conductive film, e.g. a copper film, comprising a form-locked contact to a thermally conductive layer in the multilayer circuit carrier.

Further embodiments provide a circuit carrier comprising a plurality of film interposers, wherein the same are also located above one another in the vertical direction (a three-dimensional stack of film interposers in a printed circuit board (PCB)), and the conductor paths are electrically connected.

BRIEF DESCRIPTION OF THE DRAWINGS

Embodiments of the present invention will be detailed subsequently referring to the appended drawings, in which:

FIG. 1 shows a flow diagram of a method for manufacturing a microelectronic arrangement, according to an embodiment of the present invention, FIG. 2a shows a schematic cross-sectional view of a chip-film module after the step of providing the chip-film module, according to an embodiment of the present invention, FIG. 2b shows a schematic cross-sectional view of a chip-film module after the step of providing the chip-film module, according to an embodiment of the present invention.

DETAILED DESCRIPTION OF THE INVENTION

Figure 2C:
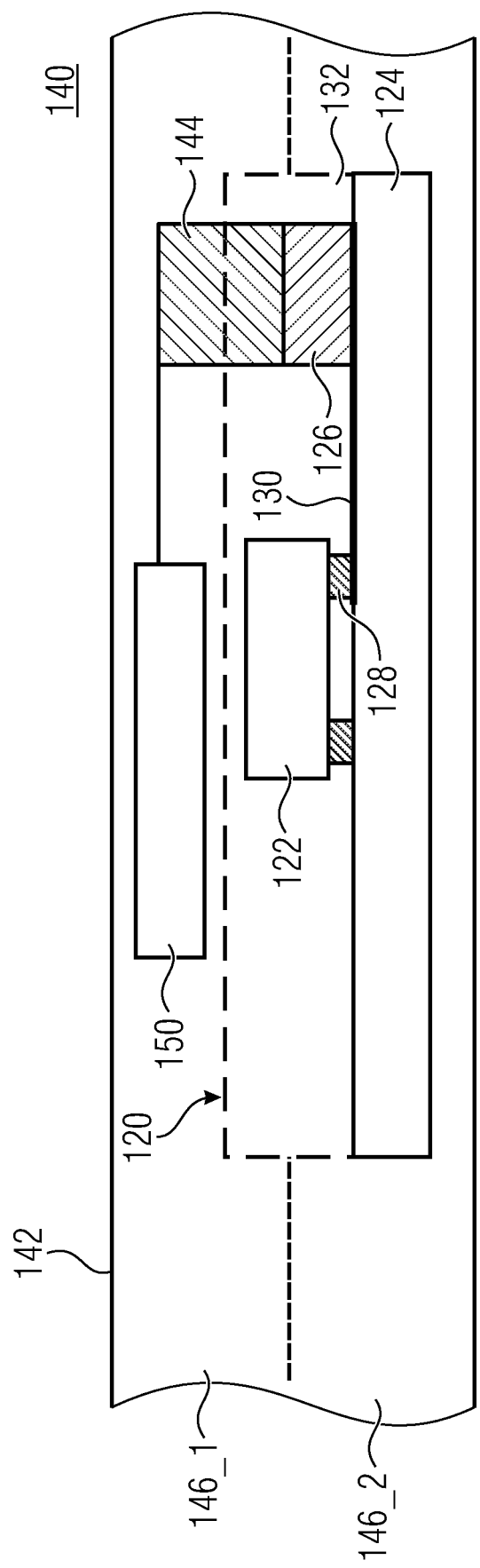
FIG. 2c shows a schematic cross-sectional view of the microelectronic arrangement after embedding the chip-film module into a printed circuit board, according to an embodiment of the present invention.

In the subsequent description of the embodiments of the present invention, the same elements or elements having the same effect are provided with the same reference numerals, thus, their description is interchangeable.

FIG. 1 shows a flow diagram of a method 100 for providing a microelectronic arrangement, according to an embodiment of the present invention. The method 100 includes a step 102 of providing a chip-film module with a semiconductor chip and a film substrate having arranged thereon the semiconductor chip, wherein the chip-film module comprises at least one coupling element spaced apart from the semiconductor chip and electrically coupled to at least one terminal of the semiconductor chip. The method 100 further includes a step 104 of embedding the chip-film module into a printed circuit board, wherein, in embedding the chip-film module into the printed circuit board, the at least one coupling element of the chip-film module is vertically coupled to at least one coupling counter element of the printed circuit board.

In embodiments, the chip-film module may be a film interposer. Interposer generally refers to an electric interface routing from at least one terminal pad, e.g. for a terminal of the semiconductor chip, to at least one other terminal pad or connection element. In embodiments, interposer refers to an electric interface routing from at least one terminal pad, e.g. for a terminal of the semiconductor chip, to at least one coupling element (e.g. an electrical, optical, inductive, capacitive or electromagnetic coupling element) as a connection element, enabling a coupling of the coupling element and, eventually, the at least one terminal of the semiconductor chip via a corresponding counter coupling element.

Embodiments of the method 100 shown in FIG. 1 are described in the following in more detail on the basis of FIGS. 2a, 2b and 2c, showing schematic cross-sectional views of the chip-film module or the microelectronic arrangement with the chip-film module integrated into the printed circuit board after different steps of the method 100.

FIG. 2a shows a schematic cross-sectional view of a chip-film module 120 after the step 102 of providing the chip-film module 120, according to an embodiment of the present invention. As can be seen in FIG. 2a, the chip-film module 120 may comprise a semiconductor chip 122 and a film substrate 124, wherein the semiconductor chip 122 is arranged on the film substrate 124, wherein the chip-film module 120 comprises at least one coupling element 126 spaced apart from the semiconductor chip 122 and electrically coupled to at least one terminal 128 of the semiconductor chip 122.

As can be further seen in FIG. 2a, the semiconductor chip 122 may optionally be (e.g. fully) embedded into the chip-film module 120, e.g. by means of an embedding layer 132 and the film substrate 124.

The embodiment shown in FIG. 2a exemplarily assumes that the at least one coupling element 126 is arranged on or in the film substrate 124 and is connected to the at least one terminal 128 of the semiconductor chip 122 via at least one conductor path 130 formed on or in the film substrate 124.

FIG. 2b shows a schematic cross-sectional view of a chip-film module 120 after the step 102 of providing the chip-film module 120, according to a further embodiment of the present invention. In contrast to the embodiment shown in FIG. 2a, the embodiment shown in FIG. 2b assumes that the semiconductor chip 122 is arranged on the film substrate 124 such that the at least one terminal 128 of the semiconductor chip faces away from the film substrate 124, wherein the at least one coupling element 126 is arranged in or on an embedding layer 132 of the chip-film module 120 in which the semiconductor chip 122 is embedded, wherein the at least one coupling element is connected to the at least one terminal of the semiconductor chip via an electric connection 130.

In embodiments, the chip-film module shown in FIG. 2a and FIG. 2b may be manufactured by using the following steps:
providing the semiconductor chip 122,
providing the film substrate 124,
connecting the semiconductor chip 122 to the film substrate 124, and optionally
embedding the semiconductor chip 122 into the embedding layer 132.

FIG. 2c shows a schematic cross-sectional view of the microelectronic arrangement 140 after embedding the chip-film module 120 into a printed circuit board 142. As can be seen in FIG. 2c, in embedding the chip-film module 120 into the printed circuit board 142, the at least one coupling element 126 of the chip-film module 120 may be vertically coupled to at least one coupling counter element 144 of the printed circuit board 142. In this case, the semiconductor chip 122 may be connected to at least one circuit component 150 of the printed circuit board 142 via the at least one coupling element 132 of the chip film module 120 and the at least one coupling counter element 144 of the printed circuit board 142.

For example, the at least one coupling element 126 of the chip-film module 120 may be an electric terminal, wherein at least one coupling element 144 of the printed circuit board 142 may be a through via. For example, a terminal area of the electric terminal 126 of the chip-film module 120 may be larger than a terminal area of the terminal 128 of the semiconductor chip (e.g. at least by the factor 1.5 or 2), and/or wherein distances between terminals 126 of the chip-film module may be larger than distances between terminals 128 of the semiconductor chip 122 (e.g. at least by the factor 1.5 or 2).

For example, the at least one coupling element 126 of the chip-film module 120 may be an optical coupling element such as an LED, a photodiode or a photodetector, whereas the at least one coupling counter element 144 of the printed circuit board 142 may be an optical coupling counter element, such as a photodetector, a photodiode, or an LED.

For example, the at least one coupling element 126 of the chip-film module 120 may be an inductive or capacitive coupling element such as a coil or a conductor loop or a capacitor plate, whereas the at least one coupling counter element 144 of the printed circuit board 142 may be an inductive or capacitive coupling counter element such as a coil, or conductor loop or a capacitor plate.

In embodiments, the printed circuit board 142 as exemplarily shown in FIG. 2c may optionally comprise two lamination planes 146_1 and 146_2 in which the chip-film module 120 is (e.g. fully) embedded.

In embodiments, the chip-film module 120 may be embedded into the printed circuit board 142 by means of the following steps:
providing at least one lamination plane 146_2 of the printed circuit board 142,
arranging the chip-film module 120 on the at least one lamination plane 146_2 of the printed circuit board 142 or within the at least one lamination plane 146_2 of the printed circuit board 142, and
providing at least one further lamination plane 146_1 of the printed circuit board 142 on and/or under the at least one lamination plane 146_2 of the printed circuit board 142 so that the chip-film module 120 is embedded into the printed circuit board 142.

In embodiments, the semiconductor chip 122 (e.g. the semiconductor component) may have a thickness of 10-250 μm, advantageously of 20 to 100 μm.

In embodiments, the film substrate 124 may have a thickness (film thickness) of 10 to 200 μm, advantageously of 15 to 50 μm.

In embodiments, the film substrate may be one of the following substrates: polyimide, PET (polyethylene terephthalate), PEN (polyethylene naphthalate), FR4 (a class of hardly inflammable and flame retardant composites of epoxy resin and glass fiber fabric), PEI (polyetherimides), LCP (liquid crystal polymer), PC (polycarbonates).

In embodiments, contacting the semiconductor chip (or, e.g., the integrated circuit, IC) may be carried out on a film sheet by means of ACA or ACF flip-chip bonding or solder assembly and underfiller.

In embodiments, in a so-called "face-up" assembly of the semiconductor chip (or the integrated circuit, IC, for example) direct contacting may be carried out by sputtering (e.g. physical vapor deposition, PVD), for example.

In the following, detailed embodiments of the chip-film module 120 are described in more detail on the basis of FIGS. 3 to 9, showing schematic cross-sectional views of different embodiments of the chip-film module 120. In this case, the chip-film module 120 comprises a semiconductor chip 122, a film substrate 124 having arranged thereon the semiconductor chip 122, and at least one coupling element 126 spaced apart from the semiconductor chip 122 and electrically coupled to at least one terminal 128 of the semiconductor chip each.

Figure 3:
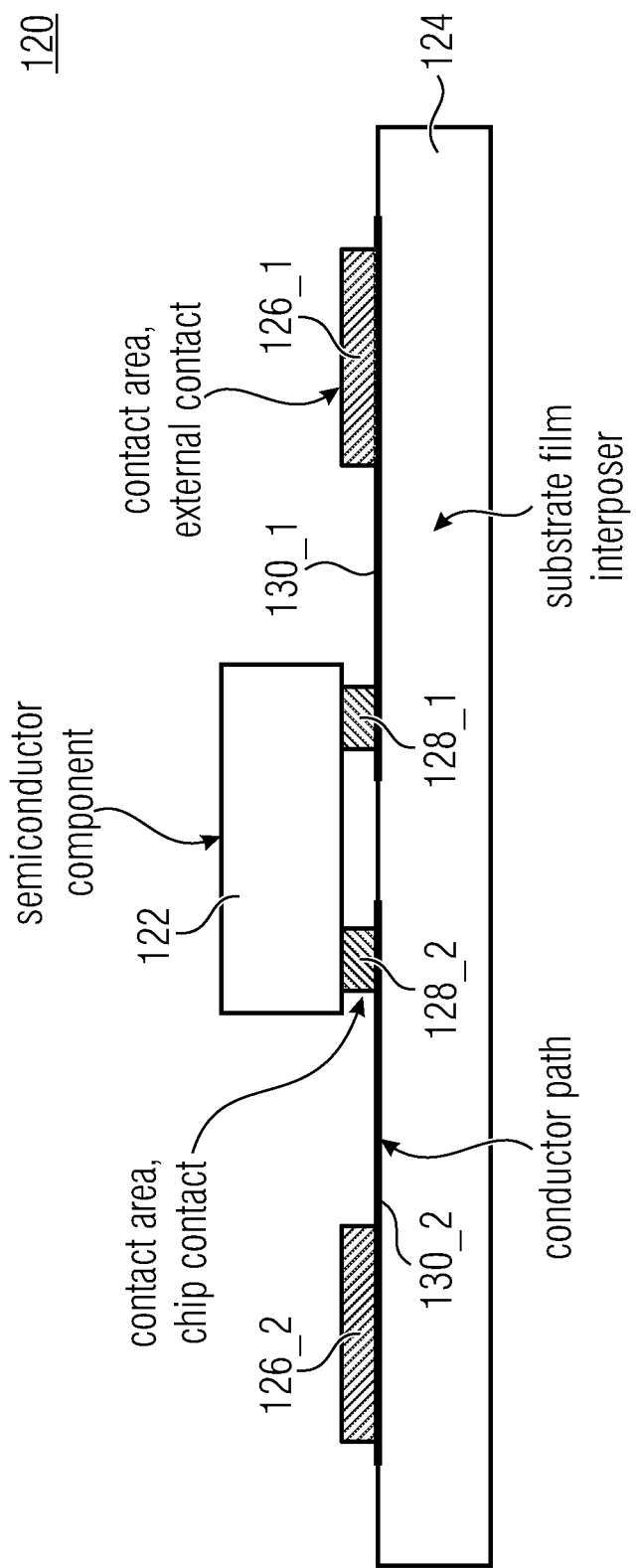
FIG. 3 shows a schematic cross-sectional view of a chip-film module, according to a first embodiment.

FIG. 3 shows a schematic cross-sectional view of a chip-film module 120, according to a first embodiment. As can be seen in FIG. 3, the film substrate 124 comprises at least two coupling elements 126_1 and 126_2 spaced apart from the semiconductor chip 122 and connected to at least two terminals 128_1 and 128_2 of the semiconductor chip 122 via two conductor paths 130_1 and 130_2 formed in or on the film substrate 124, wherein the at least two coupling elements 126_1 and 126_2 are electric terminals.

In other words, FIG. 3 shows an implementation of the chip-film module (e.g. the chip film interposer) in which the semiconductor chip 122 is mounted on the substrate film 124 by means of a so-called flip chip assembly. The chip contacts 128_1 and 128_2 are connected to the conductor paths 130_1 and 130_2 on the film substrate 124 (e.g. the interposer film), and the chip-film module 120 comprises further contact areas 126_1 and 126_2. The contact areas 126_1 and 126_2 (so-called fan-out external contacts) on the chip-film module 120 are advantageously significantly larger than the contact areas on the semiconductor chip 122 (e.g. the semiconductor component).

Figure 4:
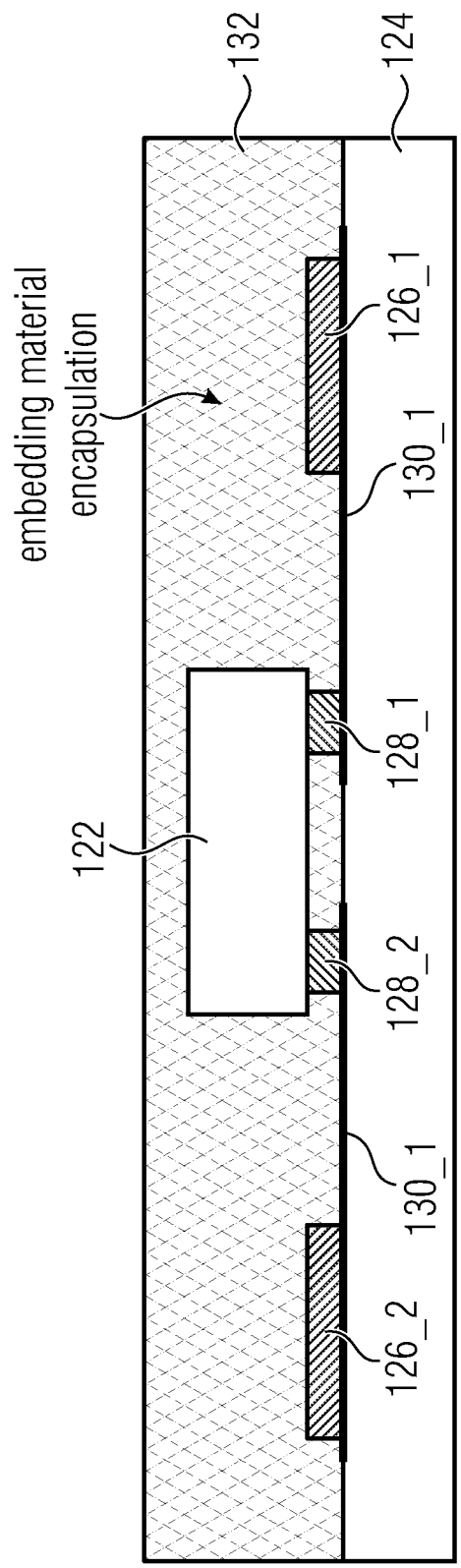
FIG. 4 shows a schematic cross-sectional view of a chip-film module, according to a second embodiment.

FIG. 4 shows a schematic cross-sectional view of a chip-film module 120, according to a second embodiment. In contrast to the embodiment shown in FIG. 3, the semiconductor chip 122 and the chip-film module 120 is (e.g. fully) embedded into an embedding layer 132 arranged on the film substrate 124.

In other words, FIG. 4 shows a chip-film module 120 (e.g. an interposer) in which the semiconductor chip 122 is embedded into an electrically insulating material 132, e.g. a polymer, thus creating an essentially plan-parallel package. The semiconductor chip 122 is well protected on the inside. The chip-film module 120 shown in FIG. 4 does not comprise any external electric contacts. The external contacts are usable only after a later integration into a printed circuit board (PCB) (cf. FIG. 11).

Figure 5:
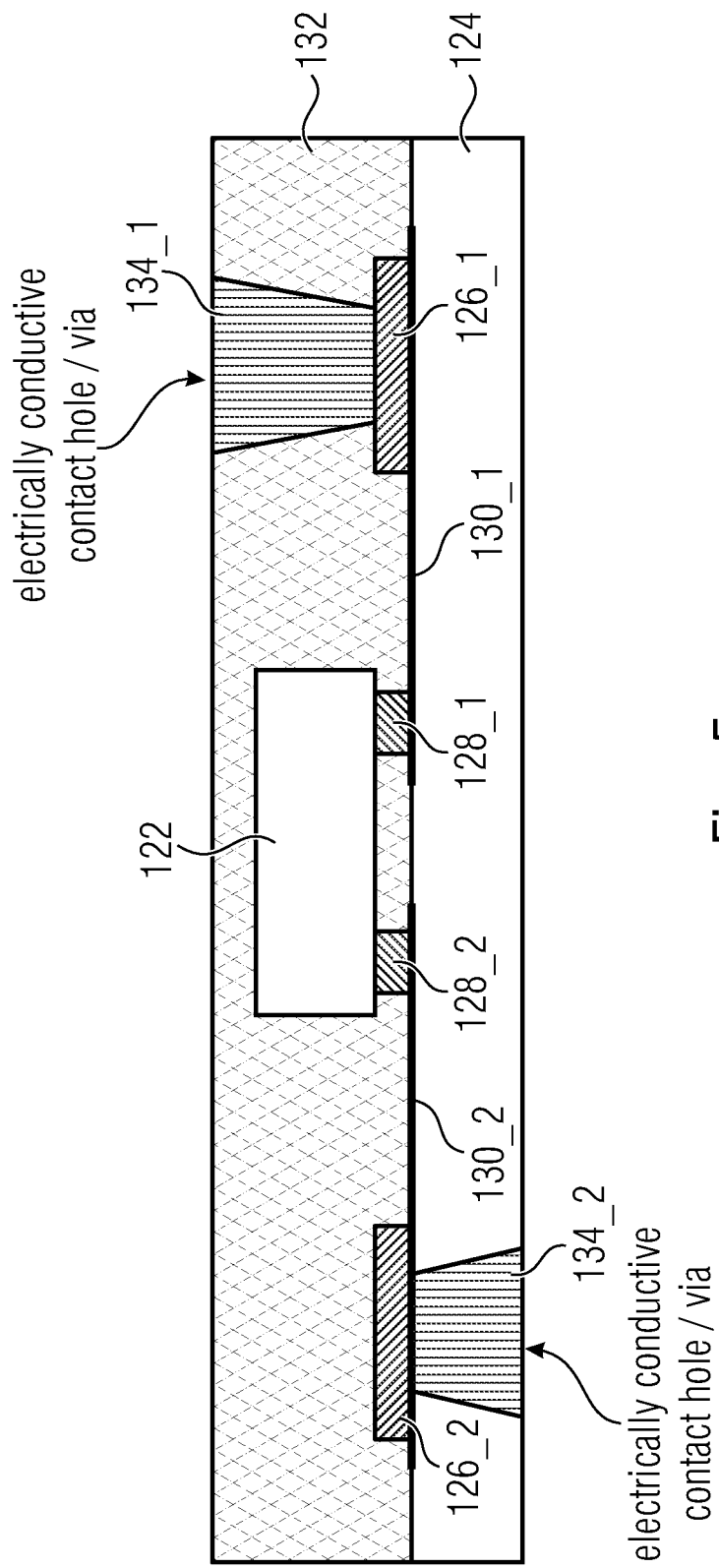
FIG. 5 shows a schematic cross-sectional view of a chip-film module, according to a third embodiment.

FIG. 5 shows a schematic cross-sectional view of a chip-film module 120, according to a third embodiment. Compared to the embodiment shown in FIG. 4, the chip-film module 120 further comprises at least two through vias 134_1 and 134_2, wherein the at least two through vias 134_1 and 134_2 extend vertically through the film substrate 124 or through the embedding layer 132 to the at least two terminals 126_1 and 126_2 of the film substrate 124.

In other words, FIG. 5 shows a chip-film module 120 (e.g. an interposer) that also comprises external contacts at the film housing (e.g. the film package). For example, this may be realized by means of an electrically conductive through via 134_1 and 134_2 through the substrate film 124 or through the encapsulation material 132.

Figure 6:
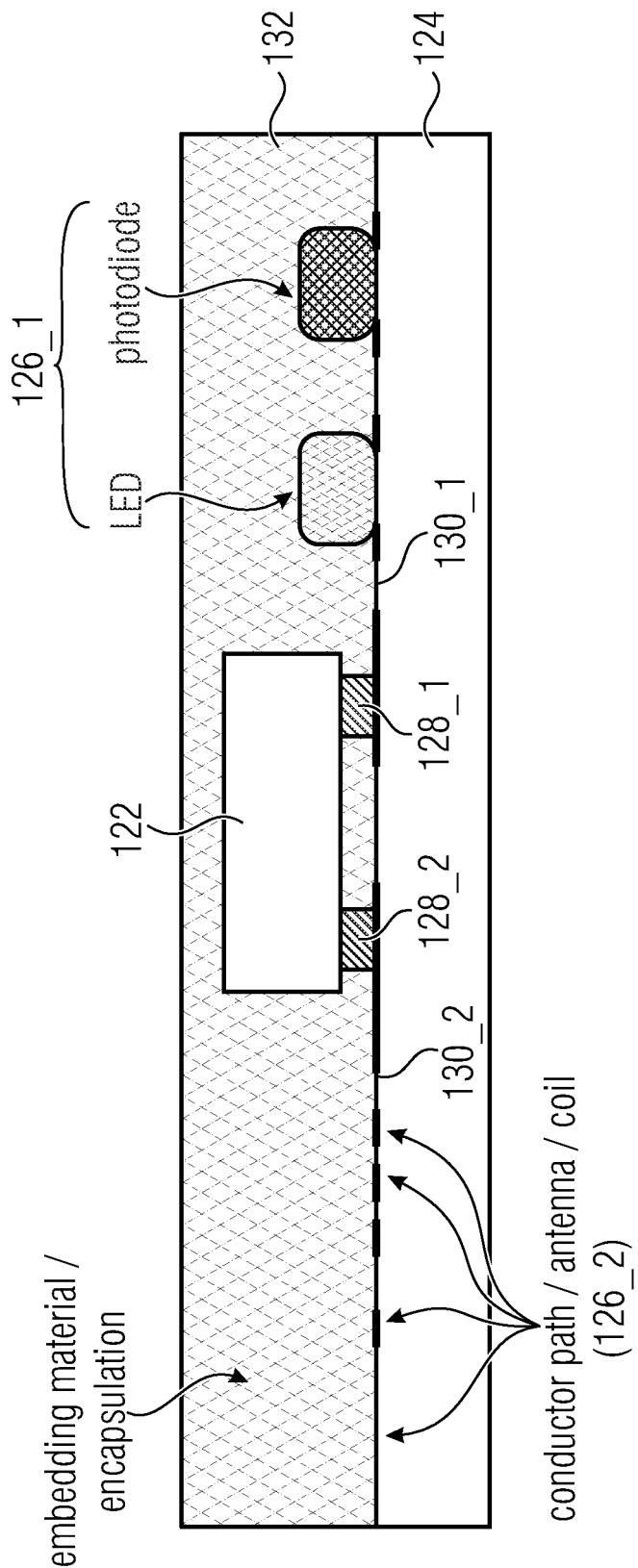
FIG. 6 shows a schematic cross-sectional view of a chip-film module, according to a fourth embodiment.

FIG. 6 shows a schematic cross-sectional view of a chip-film module 120, according to a fourth embodiment. As can be seen in FIG. 6, the film substrate 124 may comprise at least two coupling elements 126_1 and 126_2 spaced apart from the semiconductor chip 122 and connected to at least two terminals 128_1 and 128_2 of the semiconductor chip 122 via at least two conductor paths 130_1 and 130_2 formed in or on the film substrate 124.

The coupling elements may be optical coupling elements such as an LED and/or a photodiode. Additionally or alternatively, the coupling elements may be inductive, capacitive, or electromagnetic coupling elements such as a conductor loop, a coil, a capacitor plate, and/or an antenna.

In other words, FIG. 6 shows a chip-film module 120 (e.g. an interposer) that does not comprise galvanically contactable external contacts. Wireless connections via electromagnetic or optical connection paths are used to create a signal connection to the semiconductor chip 122. The first case may be done by means of antennas, e.g. a coil or dipole antenna, the second case may be done by means of a photocell that receives external signals from the outside, however, an LED placed on the chip module 120 may also transmit signals towards the outside. The energization may also be carried out by coupling in electromagnetic waves in a coil.

Figure 7:
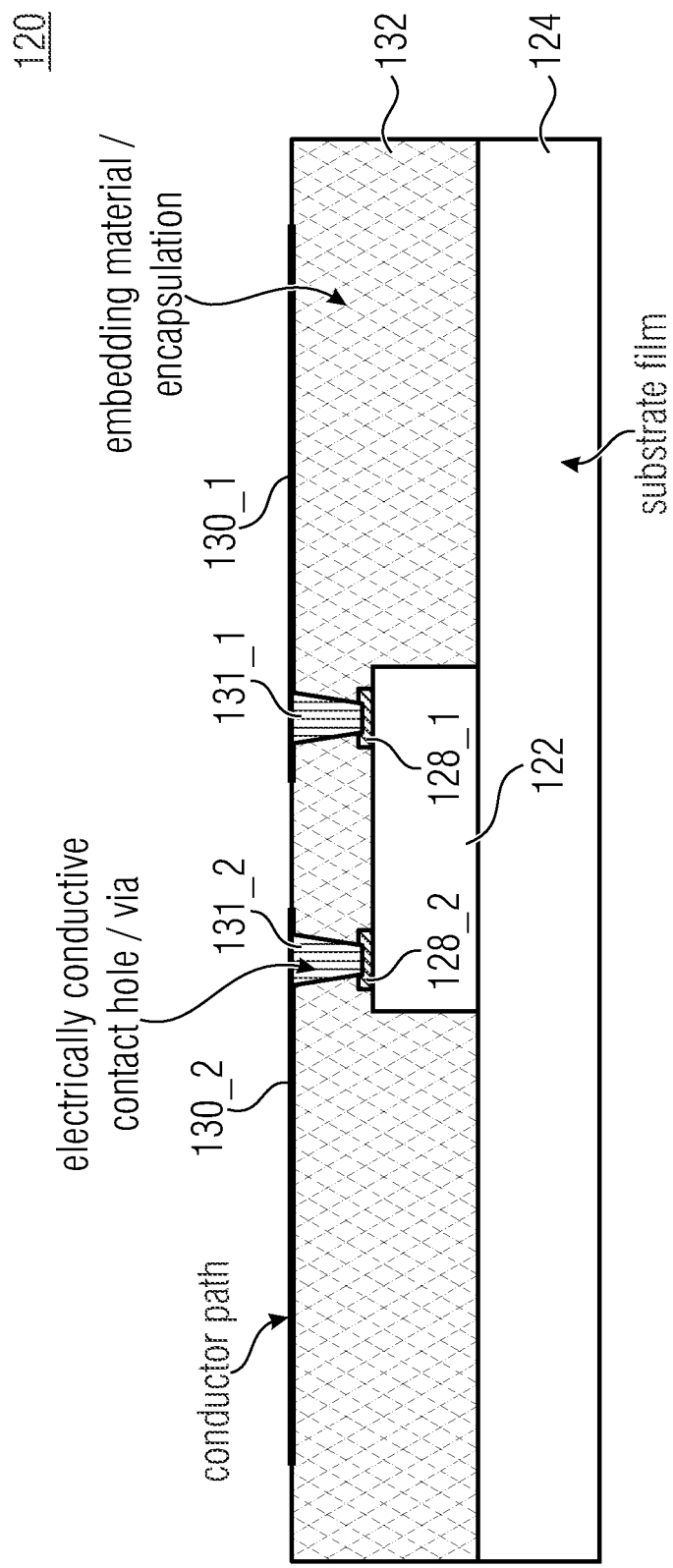
FIG. 7 shows a schematic cross-sectional view of a chip-film module, according to a fifth embodiment.

FIG. 7 shows a schematic cross-sectional view of a chip-film module 120, according to a fifth embodiment. As can be seen in FIG. 7, the semiconductor chip 122 may be arranged on the film substrate 124 such that the at least two terminals 128_1 and 128_2 of the semiconductor chip 122 face away from the film substrate 124, wherein the at least two terminals 128_1 and 128_2 are connected to at least two conductor paths 130_1 and 132_2 via two vertical electric connections 131_1 and 131_2 (e.g. electrically conductive contact holes or through vias), arranged in or on the embedding layer 132 of the chip-film module 120. In this case, the at least two conductor paths may form at least two electric coupling elements (electric terminals).

In other words, FIG. 7 shows a chip-film module 120 (e.g. an interposer) in which the semiconductor chip is placed onto the substrate film 124 in a so-called "face-up" orientation. Here, the advantage is that bump metallizations on the chip-film module 120 are not necessary. The contact pads 128_1 and 128_2 on the semiconductor chip 122 (e.g. semiconductor component) are contacted directly via vapor deposited or sputtered (e.g. physical vapor deposition, PVD) metal layers.

Figure 8:
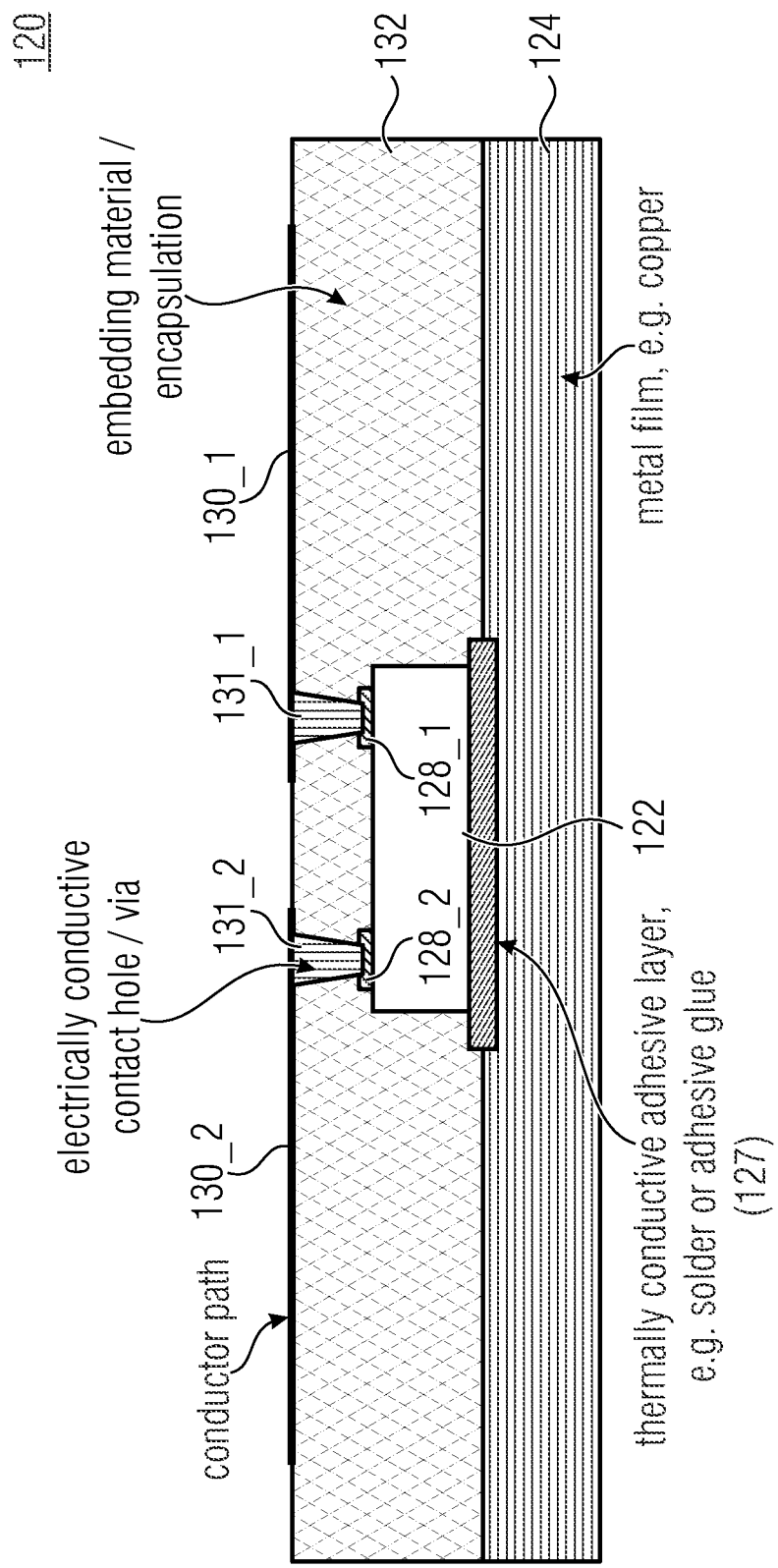
FIG. 8 shows a schematic cross-sectional view of a chip-film module, according to a sixth embodiment.

FIG. 8 shows a schematic cross-sectional view of a chip-film module 120, according to a sixth embodiment. In contrast to the embodiment shown in FIG. 7, the film substrate 124 is a thermally conductive film substrate. Here, the semiconductor chip 122 may be connected to the thermally conductive film substrate 124 via a thermally conductive adhesive layer 127, e.g. a solder or an adhesive.

In other words, FIG. 8 shows a chip-film module (e.g. an interposer) whose substrate film 124 is a metal film such as a copper film. If the semiconductor chip 122 (e.g. the semiconductor component) is mounted with its rear side onto the copper film by means of a solder connection or thermally conductive adhesive layer, the possible heat development in the semiconductor chip 122 may be very efficiently dissipated via the rear side.

Figure 9:
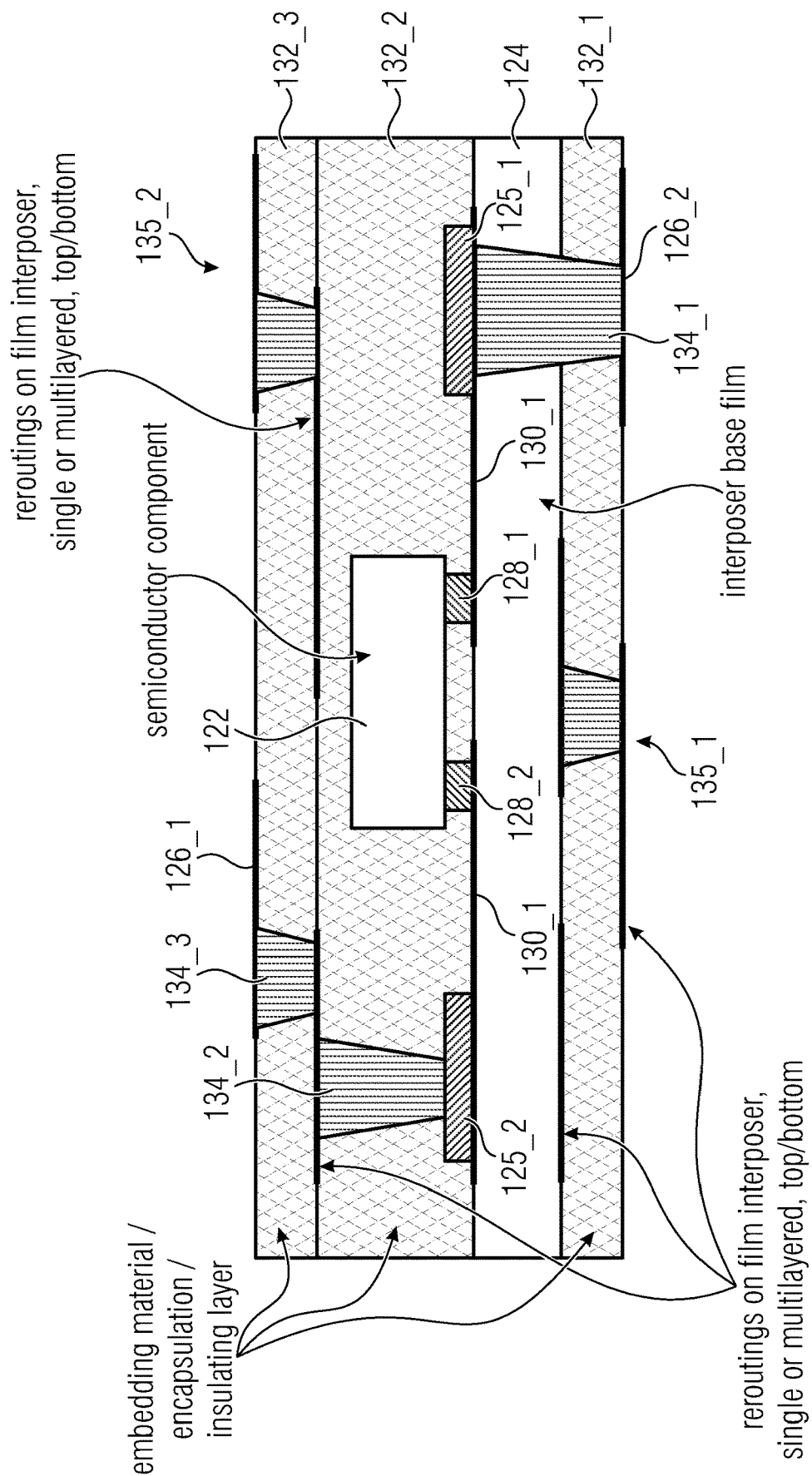
FIG. 9 shows a schematic cross-sectional view of a chip-film module, according to a seventh embodiment.

FIG. 9 shows a schematic cross-sectional view of a chip-film module 120, according to a seventh embodiment. As can be seen in FIG. 9, the film substrate 124 may comprise at least two terminal elements 125_1 and 125_2 connected to at least two terminals 128_1 and 128_2 of the semiconductor chip 122 via two conductor paths 130_1 and 130_2 formed in or on the film substrate, wherein the chip-film module 120 comprises at least two embedding layers 132_1-132_3 located above one another or in a stacked manner, embedding the semiconductor chip 122 and/or the film substrate 124, wherein the chip-film module 120 comprises at least two coupling elements 126_1 and 126_2 arranged in or on different embedding layers 132_1-132_2 of the at least two embedding layers 132_1-132_3, wherein the at least two coupling elements are connected to the at least two coupling elements 126_1 and 126_2, e.g. electric terminals, via vertical electric connections 134_1-134_3. Obviously, the chip-film module may also comprise further redistributions 135_1 and 135_2.

In other words, FIG. 9 shows a chip-film module (e.g. an interposer) comprising a multi-layered redistribution, which may be one-sided or two-sided. In other words, FIG. 9 shows a film package with a multilayer redistribution.

In the following, detailed embodiments of a microelectronic arrangement are described in more detail on the basis of FIGS. 10 to 18, resulting through the integration (e.g. embedding) of the chip-film modules 120 shown in FIGS. 3 to 9 into a printed circuit board (PCB). When integrating the respective chip-film modules 120 into the printed circuit board, the at least one coupling element 126 of the chip-film module 120 is vertically coupled to at least one coupling counter element 144 of the printed circuit board 142.

In this case, although conductor path planes are exemplarily drawn only in some of the FIGS. 10 to 16, it is to be noted that they may be available in general, and redistributions on the sheets of the printed circuit board may also have several layers.

Figure 10A:
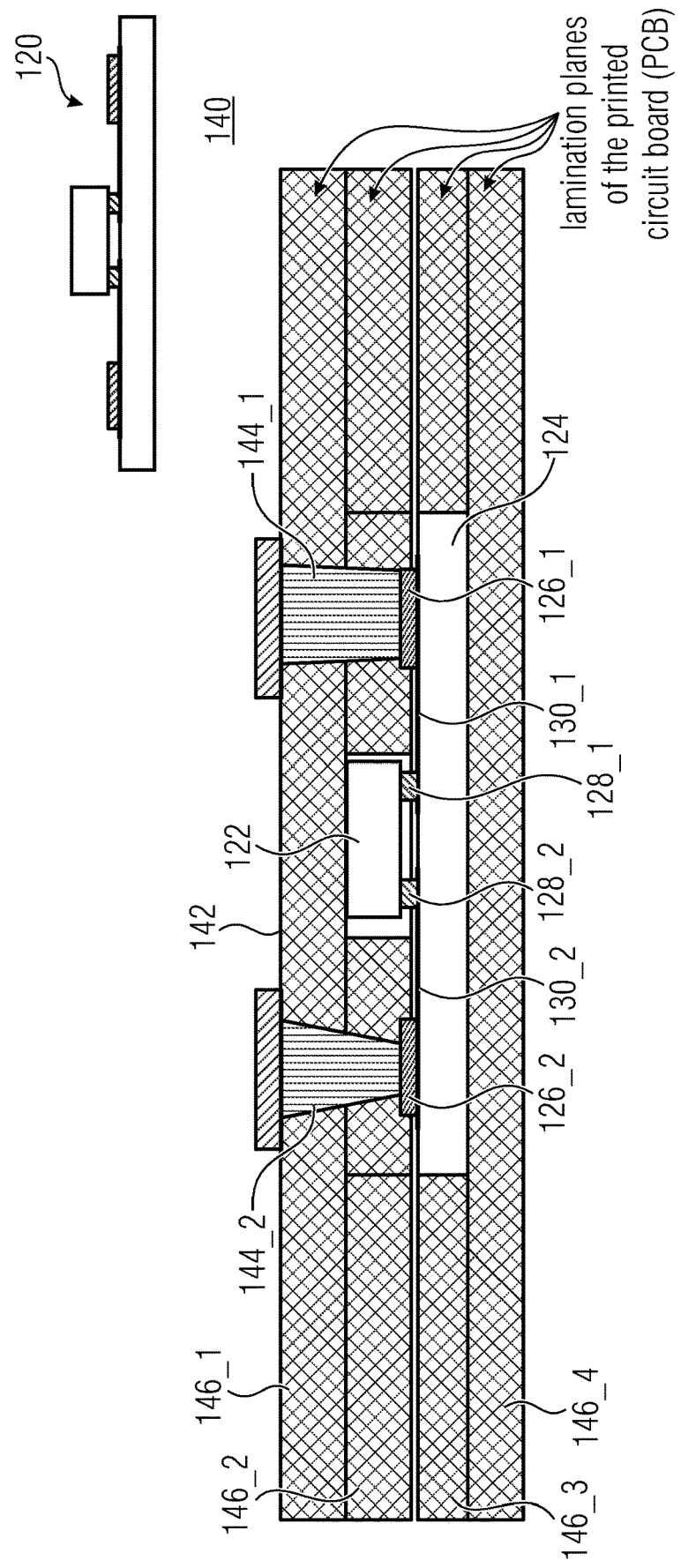
FIG. 10a-b show schematic cross-sectional views of a microelectronic arrangement with a printed circuit board and the chip-film module of FIG. 3 embedded into the printed circuit board, according to a first embodiment.
Figure 10B:
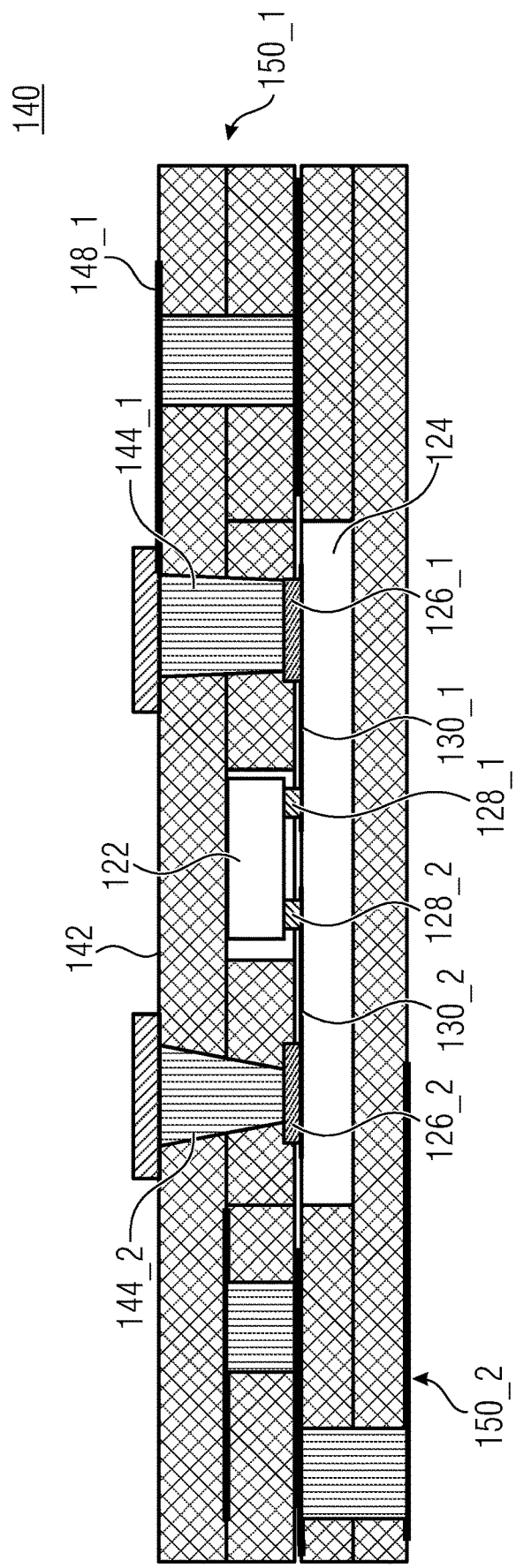

FIG. 10a shows a schematic cross-sectional view of a microelectronic arrangement 140 with a printed circuit board 142 and the chip-film module of FIG. 3 (the chip-film interposer of FIG. 3 integrated into the PCB) embedded into the printed circuit board 142, according to a first embodiment. As can be seen in FIG. 10*a*, the printed circuit board 142 may comprise several lamination planes 146_1-146_4 into which the chip-film module 120 is (e.g. fully) embedded. As can further be seen in FIG. 10*a*, the at least two terminals 126_1 and 126_2 (coupling elements) of the chip-film module 120 may be connected to at least two through vias 144_1 and 144_2 (counter coupling elements) of the printed circuit board 142. Here, the through vias 144_1 and 144_2 may be connected to conductor paths 148_1 of the printed circuit board 142, as is shown in FIG. 10*b*. In addition, the printed circuit board 142 may comprise multilayered redistributions 150_1 and 150_2.

In other words, FIGS. 10*a* and 10*b* show an integration of the chip-film module 120 of FIG. 3 into the printed circuit board 142. Here, FIG. 10*a* shows the chip-film module (e.g. the interposer) embedded into the printed circuit board 142. FIG. 10*b* exemplarily shows how conductor paths are routed to different planes in the printed circuit board 142 and how electric contacts (through vias) may be implemented between the individual conductor path planes.

In the embodiment shown in FIGS. 10*a* and 10*b*, the via contacts 144_1 and 144_2 of the printed circuit board technology terminate on contact pads 126_1 and 126_2 of the chip-film module 120 (e.g. the film interposer). For example, these vias 144_1 and 144_2 may be generated by means of mechanical drilling or laser drilling. The open vias are then provided with a metallization layer and are typically filled with copper by means of a galvanic process.

Figure 11:
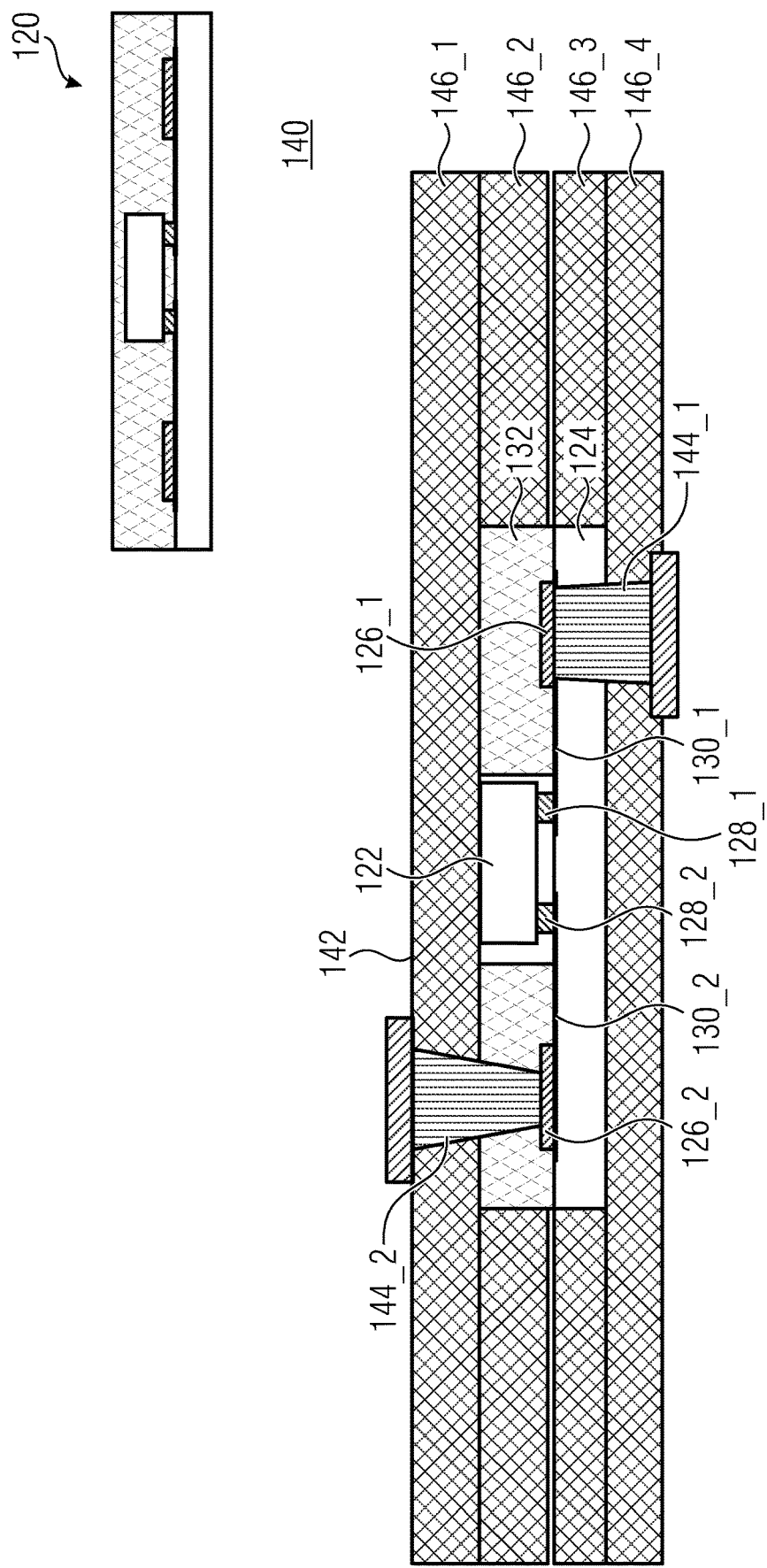
FIG. 11 shows a schematic cross-sectional view of a microelectronic arrangement with a printed circuit board and the chip-film module of FIG. 4 embedded into the printed circuit board, according to a second embodiment.

FIG. 11 shows a schematic cross-sectional view of a microelectronic arrangement 140 with a printed circuit board 142 and the chip-film module of FIG. 4 (the chip-film interposer of FIG. 4 integrated into the PCB) embedded into the printed circuit board 142, according to a second embodiment. As can be seen in FIG. 11, the printed circuit board 142 may comprise several lamination planes 146_1-146_4 into which the chip-film module 120 is (e.g. fully) embedded. As can be seen in FIG. 11, the at least two terminals 126_1 and 126_2 (coupling elements) of the chip-film module 120 may be connected to at least two through vias 144_1 and 144_2 (counter coupling elements) of the printed circuit board 142. Here, the at least two through vias 144_1 and 144_2 may extend vertically through the film substrate 124 or through the embedding layer 132 to the at least two terminals 126_1 and 126_2 of the film substrate 124.

In other words, FIG. 11 shows an integration of the chip-film module 120 shown in FIG. 4 into a printed circuit board. In this case, the through vias 144_1 and 144_2 of the printed circuit board technology may penetrate the lamination planes of the printed circuit board and the chip embedding material 132 of the chip-film module 120 (the film interposer) or, when being contacted from the lower side, the substrate film 124 of the chip-film module 120 (e.g. the interposer).

Figure 12:
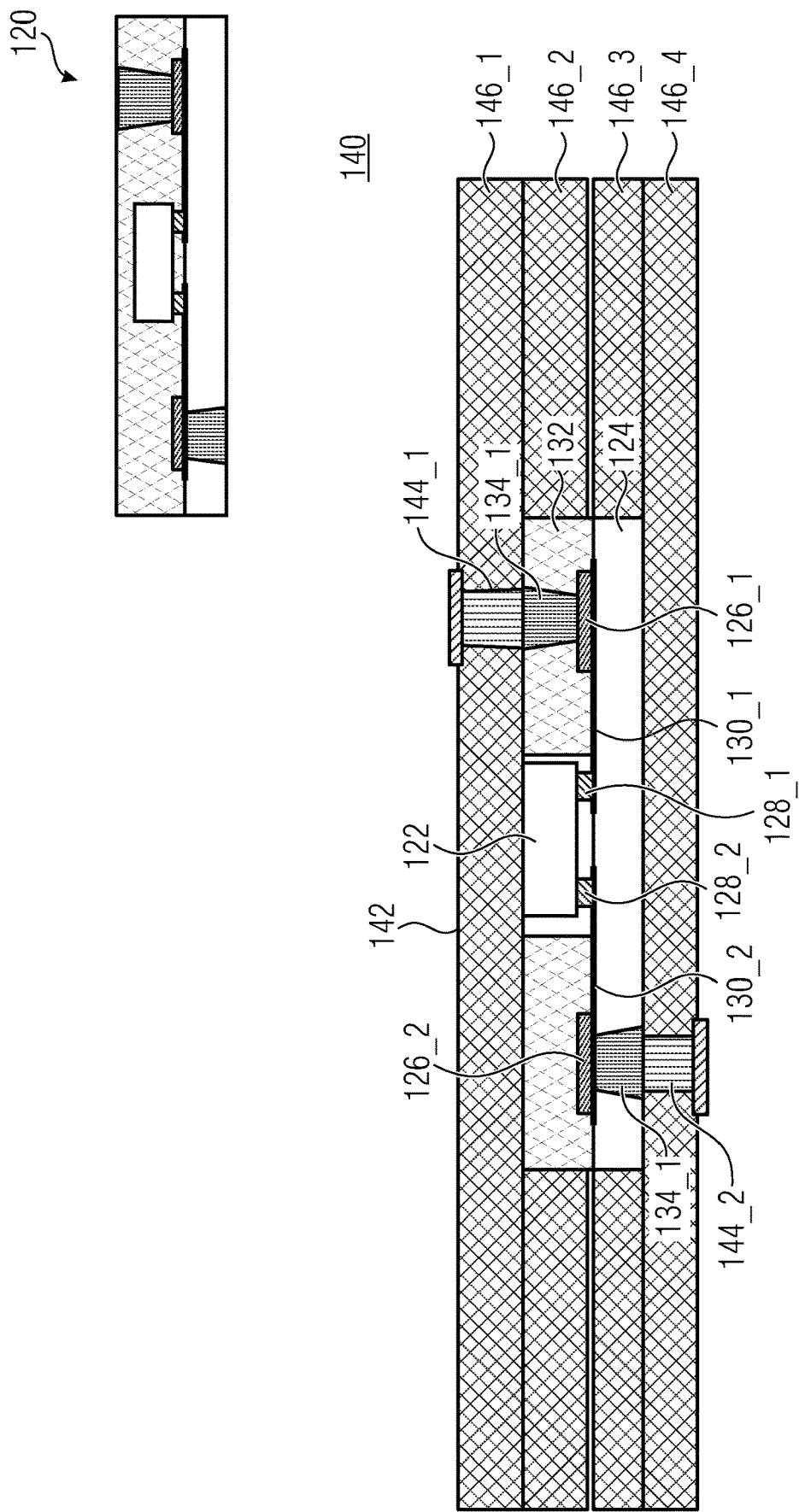
FIG. 12 shows a schematic cross-sectional view of a microelectronic arrangement with a printed circuit board and the chip-film module of FIG. 5 embedded into the printed circuit board, according to a third embodiment.

FIG. 12 shows a schematic cross-sectional view of a microelectronic arrangement 140 with a printed circuit board 142 and the chip-film module of FIG. 5 (the chip-film interposer of FIG. 5 integrated into a PCB) embedded into the printed circuit board 142, according to a third embodiment. As can be seen in FIG. 12, the printed circuit board 142 may comprise several lamination planes 146_1-146_4 into which the chip-film module 120 is (e.g. fully) embedded. As can further be seen in FIG. 12, the at least two terminals 126_1 and 126_2 (coupling elements) of the chip-film module 120, which are routed towards the outside via at least two through vias 134_1 and 134_2, may be connected to at least two through vias 144_1 and 144_2 (counter coupling elements) of the printed circuit board 142.

In other words, FIG. 12 shows an integration of the chip-film module 120 (e.g. the interposer) shown in FIG. 5. In this case, the through vias 144_1 and 144_2 of the printed circuit board technology terminate on the external contact areas 134_1 and 134_2 of the chip-film module 120.

Figure 13:
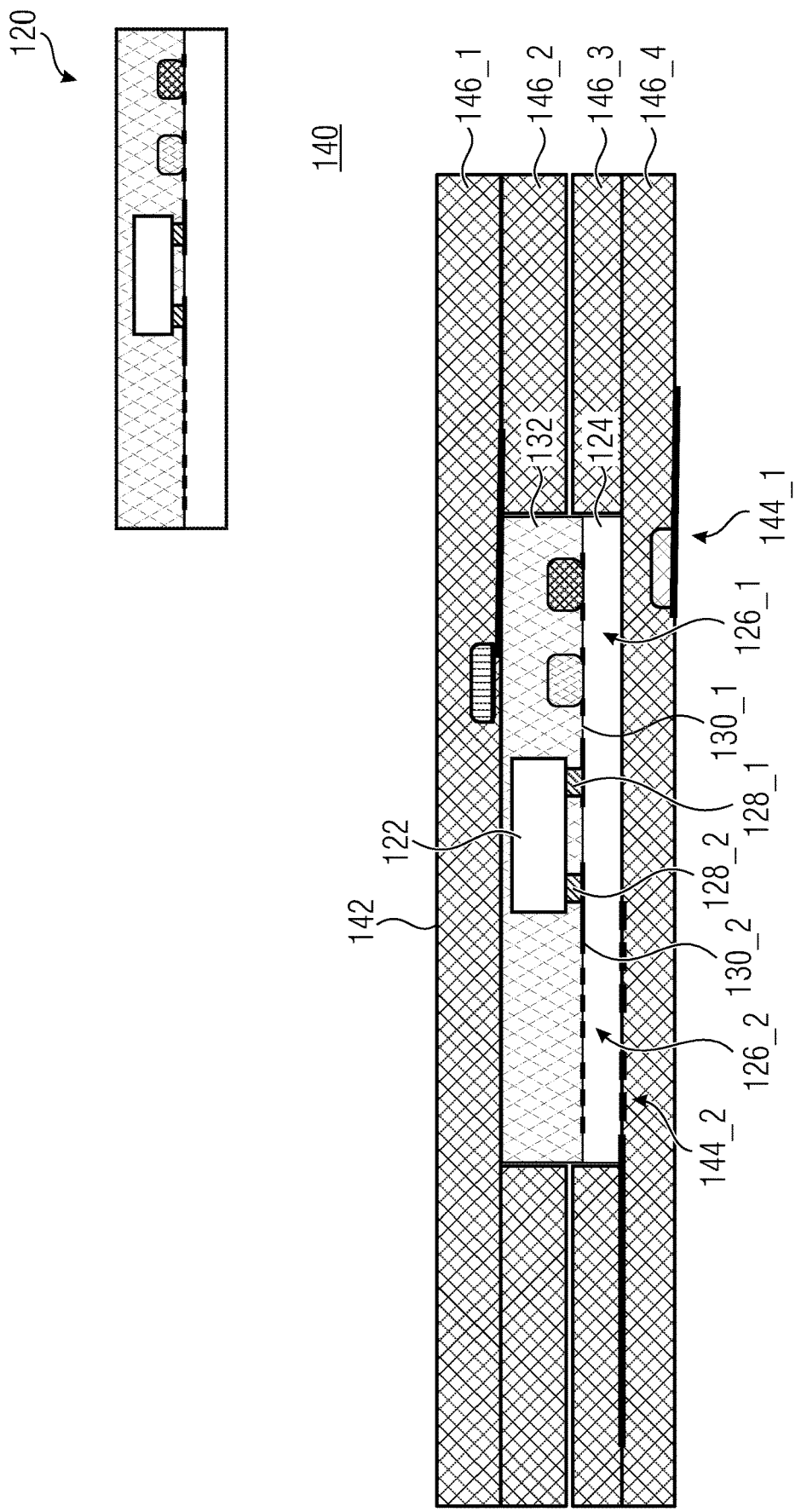
FIG. 13 shows a schematic cross-sectional view of a microelectronic arrangement with a printed circuit board and the chip-film module of FIG. 6 embedded into the printed circuit board, according to a fourth embodiment.

FIG. 13 shows a schematic cross-sectional view of a microelectronic arrangement 140 with a printed circuit board 142 and the chip-film module of FIG. 6 (the chip-film interposer of FIG. 6 integrated into a PCB) embedded into the printed circuit board 142, according to a fourth embodiment. As can be seen in FIG. 13, the printed circuit board 142 may comprise several lamination planes 146_1-146_4 into which the chip-film module 120 is (e.g. fully) embedded. As can further be seen in FIG. 13, the printed circuit board may comprise at least two coupling counter elements 144_1 and 144_2 vertically coupled to the at least two coupling elements 126_1 and 126_2 of the chip-film module 120. The coupling counter elements may be optical coupling elements such as an LED and/or a photodiode. Additionally or alternatively, the coupling counter elements may be inductive, capacitive, or electromagnetic coupling elements such as a conductor loop, a coil, a capacitor plate, and/or an antenna.

In other words, FIG. 13 shows an integration of the chip-film module 120 (e.g. the interposer) shown in FIG. 6. In this case, there is no galvanic coupling between conductor paths of the printed circuit board 142 and the semiconductor chip 122 (e.g. chip component). Instead, antennas or optoelectronic signal couplings are provided between the conductor paths of the printed circuit board 142 and the conductor paths of the chip-film module 120. The coupling means (coupling elements 126_1 and 126_2 and coupling counter elements 144_1 and 144_2) are to be implemented in a complementary manner, i.e. antenna over antenna and LED opposite photocell.

Figure 14:
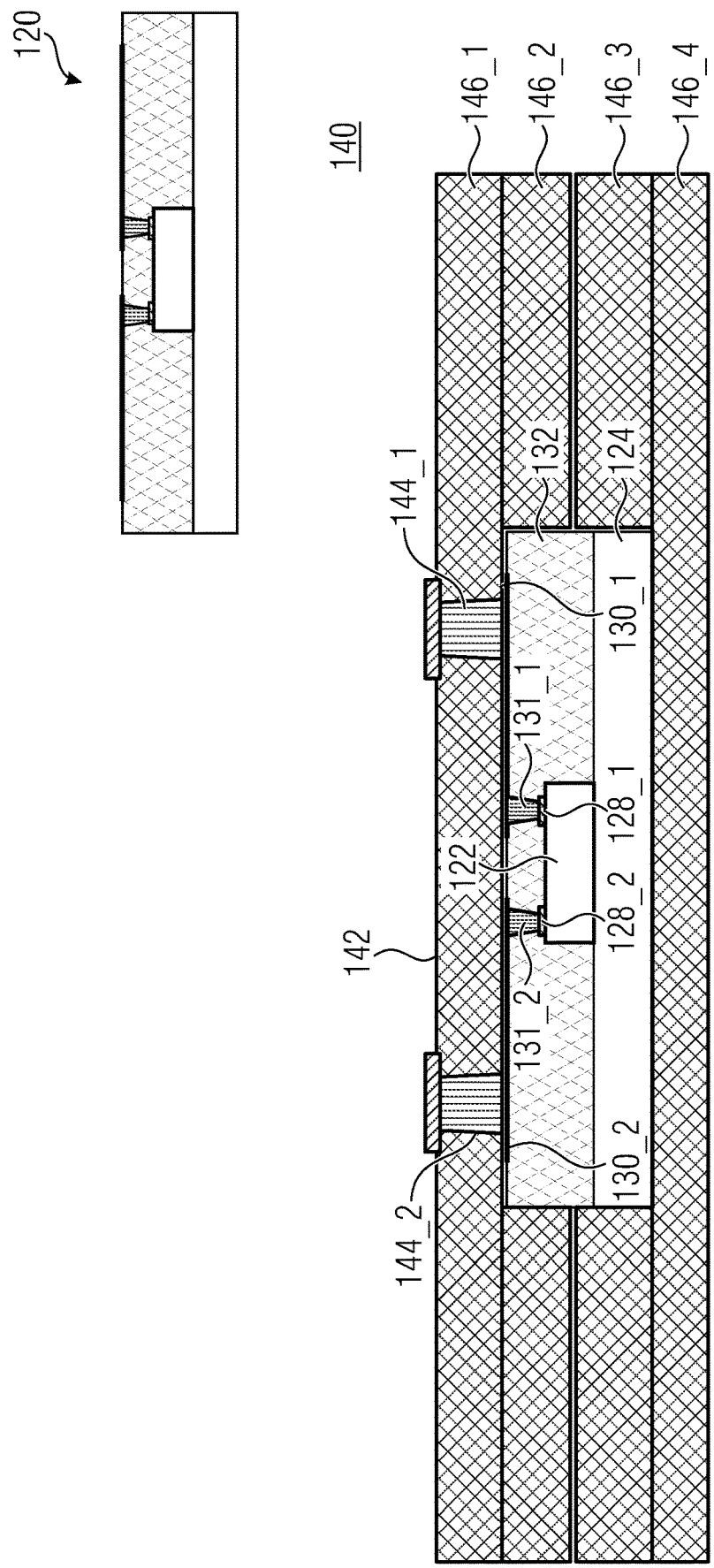
FIG. 14 shows a schematic cross-sectional view of a microelectronic arrangement with a printed circuit board and the chip-film module of FIG. 7 embedded into the printed circuit board, according to a fifth embodiment.

FIG. 14 shows a schematic cross-sectional view of a microelectronic arrangement 140 with a printed circuit board 142 and the chip-film module of FIG. 7 (the chip-film interposer of FIG. 7 integrated into a PCB) embedded into the printed circuit board 142, according to a fifth embodiment. As can be seen in FIG. 14, the printed circuit board 142 may comprise several lamination planes 146_1-146_4 into which the chip-film module 120 is (e.g. fully) embedded. As can further be seen in FIG. 14, the at least two conductor paths 130_1 and 130_2 of the chip-film module 120 forming at least two electrical terminals may be coupled by at least two through vias 144_1 and 144_2 of the printed circuit board 142.

In other words, FIG. 14 shows an integration of the chip-film module 120 (e.g. the interposer) shown in FIG. 7.

Figure 15A:
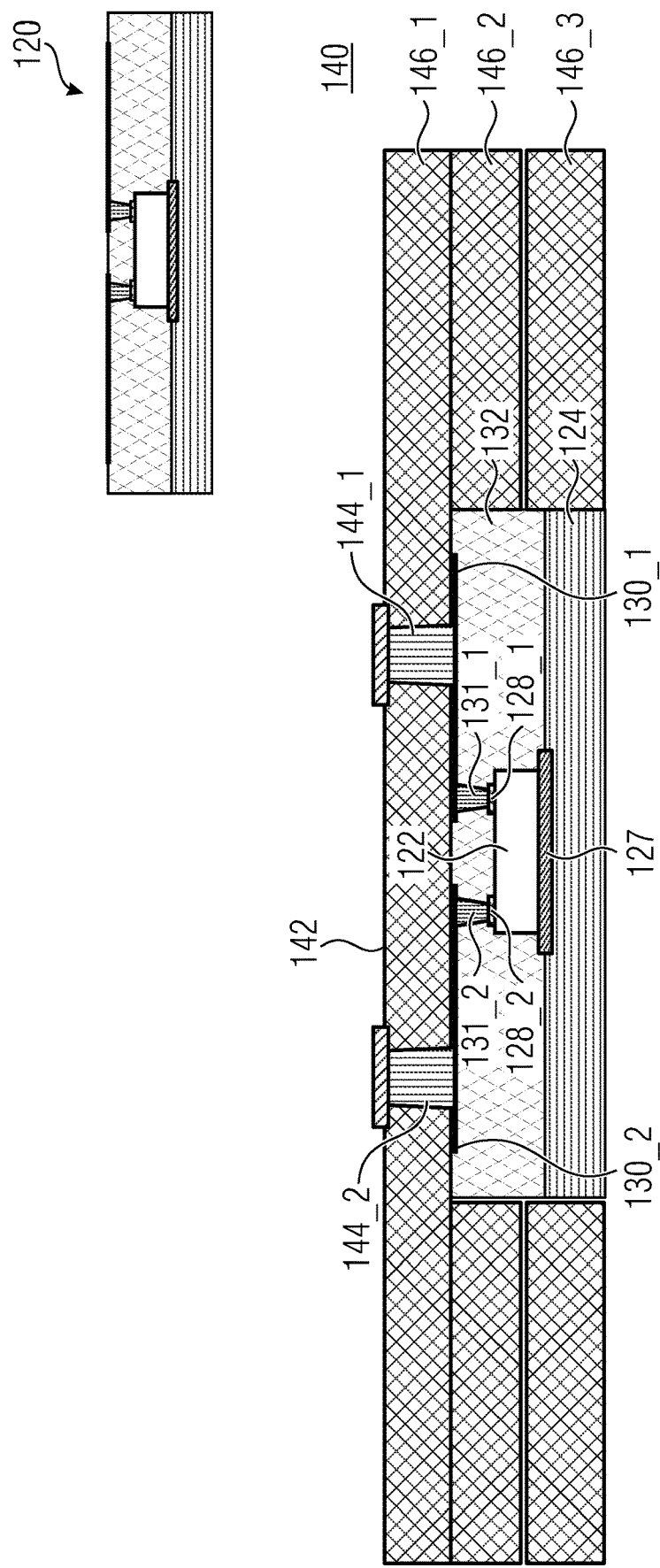
FIG. 15a-b shows a schematic cross-sectional view of a microelectronic arrangement with a printed circuit board and the chip-film module of FIG. 8 embedded into the printed circuit board, according to a sixth embodiment.

FIG. 15*a* shows a schematic cross-sectional view of a microelectronic arrangement 140 with a printed circuit board 142 and the chip-film module of FIG. 8 (the chip-film interposer of FIG. 8 integrated into a PCB) embedded into the printed circuit board 142, according to a sixth embodiment. As can be seen in FIG. 15*a*, the at least two conductor paths 130_1 and 130_2 of the chip-film module 120 forming at least two electric terminals may be coupled in by at least two through vias 144_1 and 144_2 of the printed circuit board 142. As can further be seen in FIG. 15*a*, the printed circuit board 142 may comprise several lamination planes 146_1-146_3 into which the chip-film module 120 is embedded such that the thermally conductive film substrate 124 of the chip-film module 120 is exposed, i.e. is not embedded (e.g. terminates essentially in a flush manner with a surface (e.g. bottom side) of the printed circuit board 142). Alternatively, the chip-film module 120 may also be fully embedded into the printed circuit board 142, e.g. by means of a further lamination plane 146_4, as is shown in FIG. 15b, wherein the printed circuit board 142 comprises, adjacent to the thermally conductive film substrate 124 (e.g. within the fourth lamination plane 146_4), thermal through vias 137 configured to conduct thermal energy from the thermally conductive film substrate 124 to a surrounding area of the printed circuit board 142.

Figure 15B:
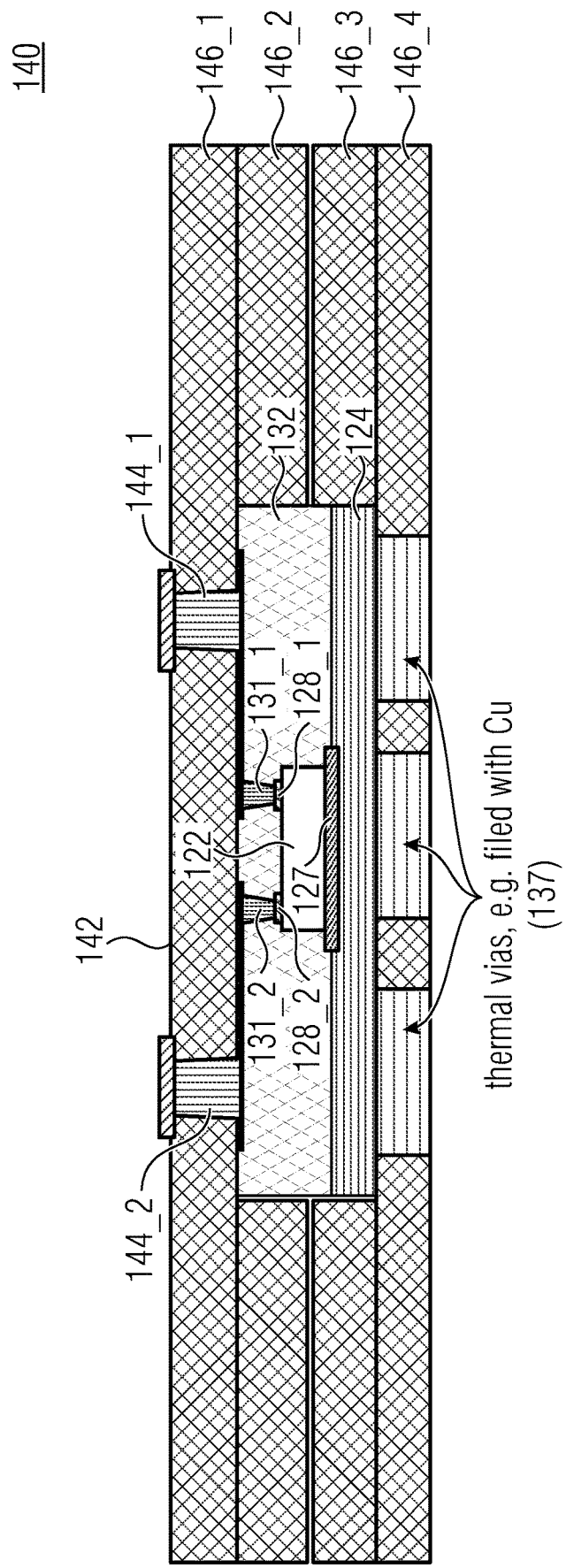

In other words, FIGS. 15a and 15b show an integration of the chip-film module 120 (e.g. the interposer) shown in FIG. 8, wherein the base film 124 is a thermally conductive film such as a copper film. To this end, two possible variations are shown: the thermally conductive film (e.g. the Cu film) of the chip-film module 120 (e.g. the interposer) remains open at its rear side after the full integration into the printed circuit board 142 (PCB); it may therefore be soldered onto a further substrate (not shown here) or may be brought into contact with an air cooler or liquid cooler. Second implementation: the chip-film module 120 is fully embedded into the printed circuit board 142 (PCB). To still keep the heat dissipation as high as possible, so-called thermal through vias 137 are created under the chip-film module 120 (e.g. the interposer), advantageously with metal connection technologies (soldering, sintering) or high-heat conductive materials such as graphite, aluminum nitride, etc.

Figure 16:
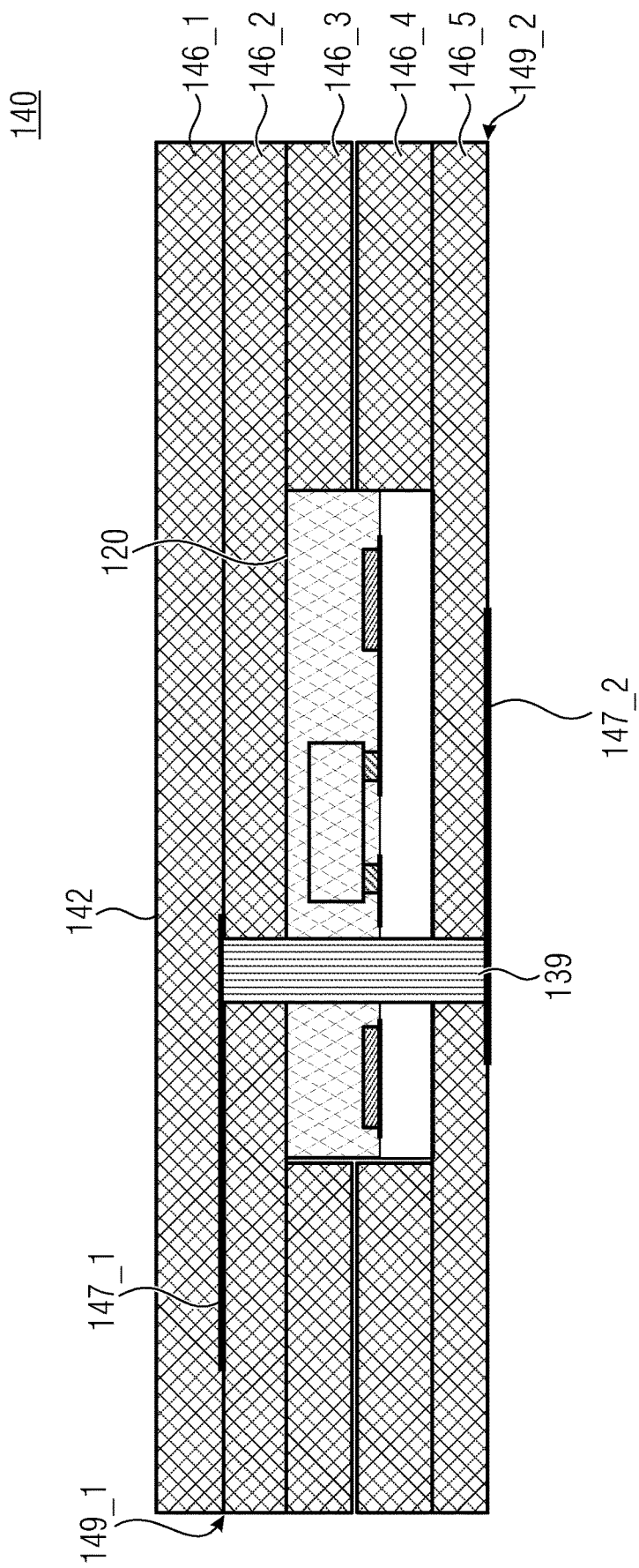
FIG. 16 shows a schematic cross-sectional view of a microelectronic arrangement with a printed circuit board and an arbitrary chip-film module embedded into the printed circuit board, according to a seventh embodiment.

FIG. 16 shows a schematic cross-sectional view of a microelectronic arrangement 140 with a printed circuit board 142 and an arbitrary chip-film module 120 embedded into the printed circuit board 142, according to a seventh embodiment. As can be seen in FIG. 16, the printed circuit board 142 may comprise several lamination planes 146_1-146_5 into which the chip-film module 120 is (e.g. fully) embedded. As can further be seen in FIG. 16, the printed circuit board 142 may comprise at least two conductor path planes 149_1 and 149_2, wherein the chip-film module 120 is arranged between the at least two conductor path planes 149_1 and 149_2, wherein, in embedding the chip-film module 120 into the printed circuit board 142, a vertical through via 139 through the chip-film module 120 is formed for connecting conductor paths 147_1 and 147_2 of the at least two conductor path planes 149_1 and 149_2.

In other words, FIG. 16 shows an integration of an arbitrary chip-film module 120 (e.g. a chip-film module shown in FIGS. 3 to 9) into the printed circuit board 142. In the embodiment shown in FIG. 16, a through via 139 of the printed circuit board (PCB) technology is routed through the chip-film module 120 (e.g. the film interposer) without electric contact to the conductor paths of the chip-film module 120. Wiring paths on the chip-film module without any contact to the semiconductor chip 122 (e.g. the semiconductor component) may also be combined with wiring paths of the printed circuit board 142. This has advantages: for example, the surface are of the chip-film module 120 is not lost for implementing the wiring (also called "routing"). Despite the chip-film module 120, a high-density wiring may be achieved on the printed circuit board 142 (PCB). In addition, secure wiring concepts may be planned and implemented in the circuitry architecture, e.g. by mapping part of the wiring of the overall system on the chip-film module 120, and another part in the printed circuit board (PCB) layout. This provides new possibilities with respect to counterfeit security of the system. For example: the IC design, interposer design and PCB design are implemented by different providers; only the client has full knowledge about the contacting paths and functionalities of the overall system. A reproduction or copy of the overall electric system is therefore significantly impeded.

Figure 17:
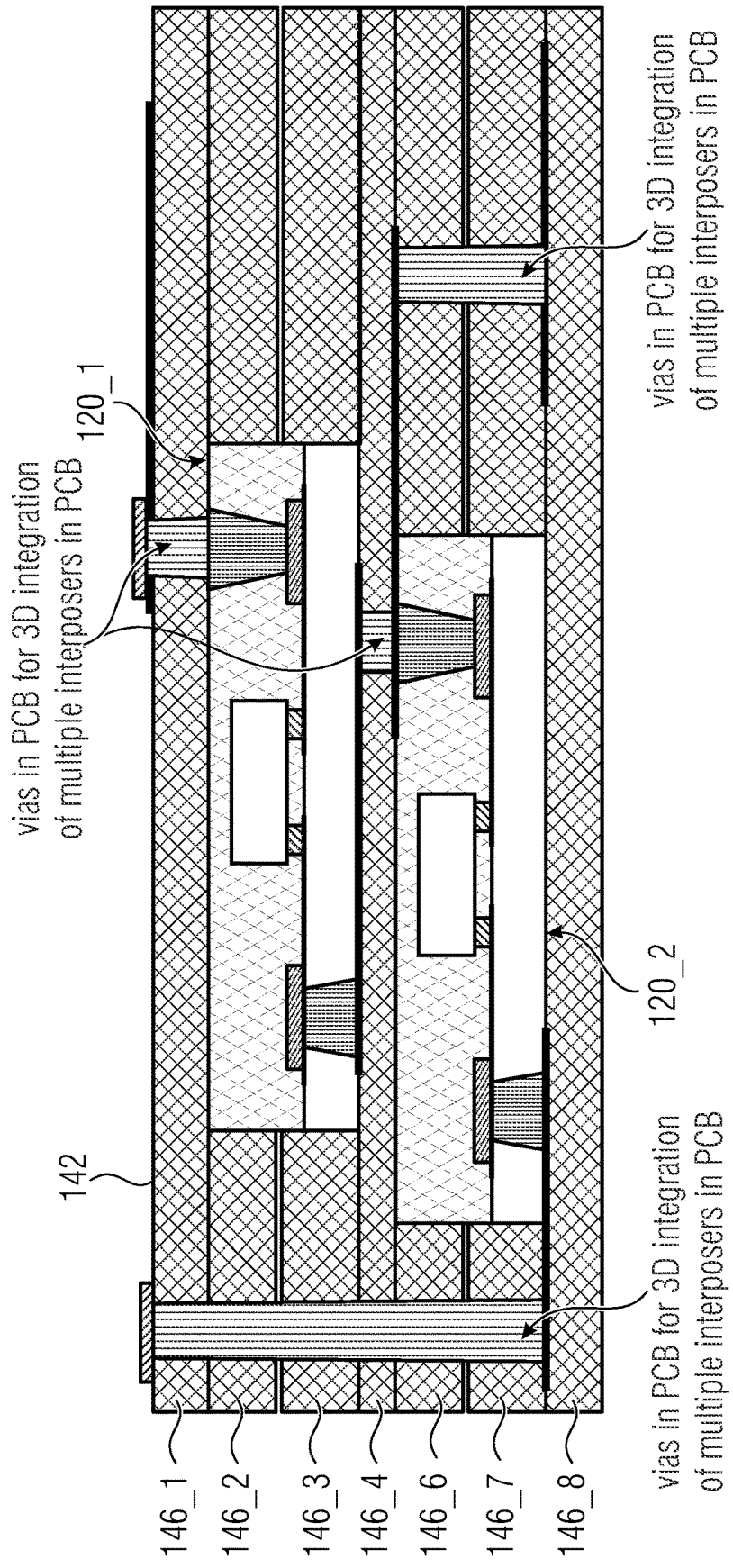
FIG. 17 shows a schematic cross-sectional view of a microelectronic arrangement with a printed circuit board and two arbitrary chip-film modules embedded into the printed circuit board, according to an eighth embodiment.

FIG. 17 shows a schematic cross-sectional view of a microelectronic arrangement 140 with a printed circuit board 142 and two arbitrary chip-film modules 120 embedded into the printed circuit board 142, according to an eighth embodiment. As can be seen in FIG. 17, the two chip-film modules 120 may be stacked in the vertical direction of the printed circuit board 142 and may be embedded fully into the printed circuit board 142 by means of several lamination planes 146_1-146_8.

In other words, FIG. 17 shows a possibility for a three-dimensional multi-integration of chip-film modules 120 (e.g. film interposers) into the printed circuit board 142. This is only possible because the thin film-based chip-film modules 120 are well integrateable and stackable.

Figure 18:
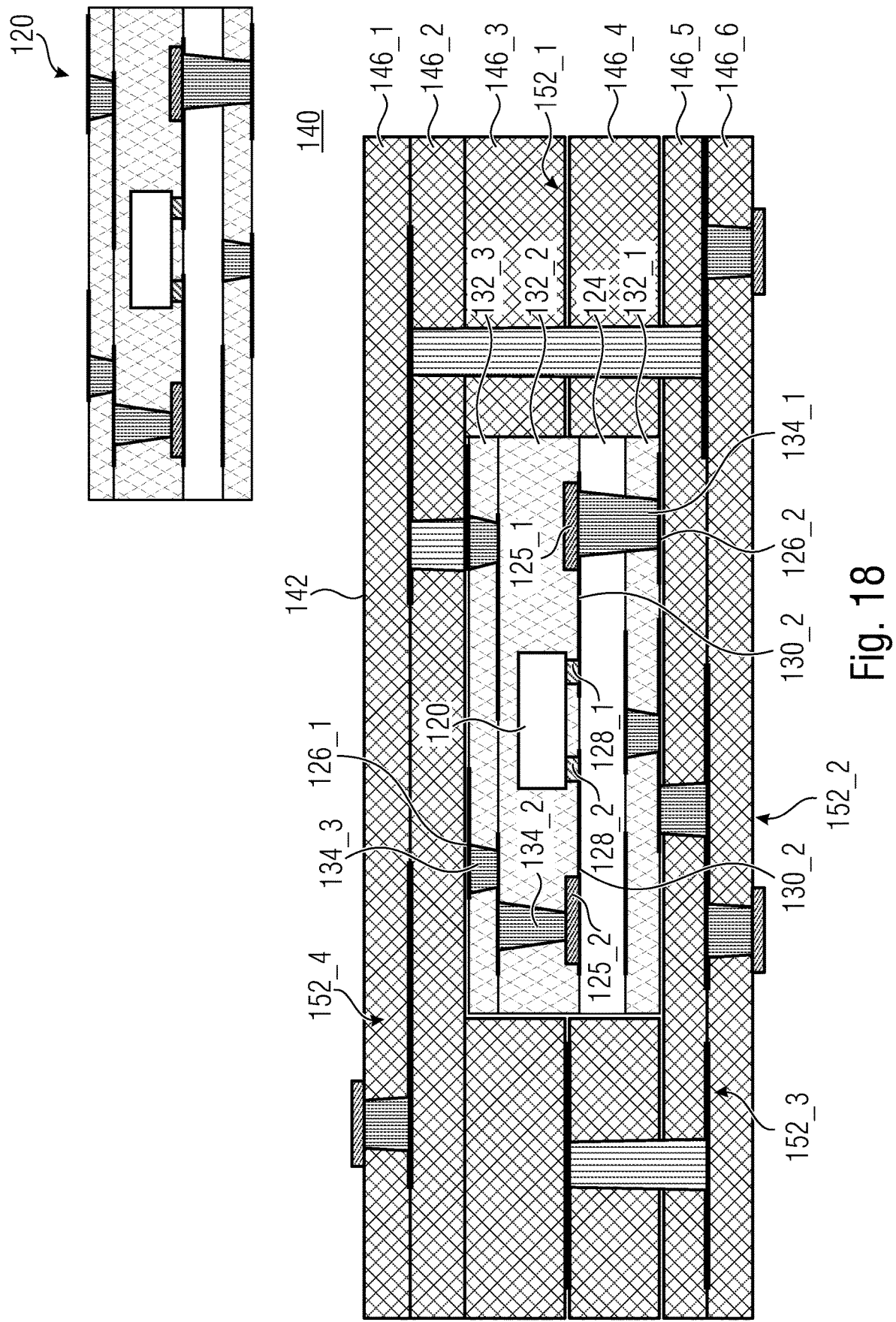
FIG. 18 shows a schematic cross-sectional view of a microelectronic arrangement with a printed circuit board and the chip-film module of FIG. 9 embedded into the printed circuit board, according to a ninth embodiment.

FIG. 18 shows a schematic cross-sectional view of a microelectronic arrangement 140 with a printed circuit board 142 and the chip-film module 120 of FIG. 9 (chip-film interposer of FIG. 9 integrated into a PCB) embedded into the printed circuit board 142, according to a ninth embodiment. As can be seen in FIG. 18, the chip-film module 120 may be fully embedded into the printed circuit board 120, e.g. by means of several lamination planes 146_1-146_6. As can be further seen in FIG. 18, the printed circuit board 142 may comprise several multi-layered redistributions 152_1-152_4.

In other words, FIG. 18 shows the integration of the chip-film module 120 (e.g. the interposer) shown in FIG. 9 into a printed circuit board 142, which itself already comprises a multi-layer redistribution on or in the film interposer.

The chip-film module 120 of FIG. 9 or 18 is particularly advantageous since it may be used to integrate semiconductor components with many contact pads on the chip, e.g. processors, into a chip-film module 120. In turn, this is a particular feature of a chip-film module 120 because having several layers is easily technologically achievable on polymer layers.

In the following, advantages of embodiments of the present invention are described.

In embodiments, the requirement of the expansion of the very small contact pads on a semiconductor chip (e.g. a semiconductor component) is realized on a chip-film module (a film interposer), and so is the implementation of contact pads with a sufficiently stable (=thick) metallization (e.g. copper pads with a thickness of 2-5 µm, possibly also with being gilded as an oxidation protection). Thus, what is omitted is the technological realization of a redistribution plane on the starting wafer of the semiconductor chip in a wafer factory, as is conventionally the case.

The additional method steps needed for manufacturing the chip-film module (e.g. the film interposer) on cost-efficient large-format substrate films may in turn be carried out on a large scale with simplified process technology (not with sub-µm process technology in expensive clean rooms of the wafer factories) in clean laboratories and therefore in a cost-efficient multiple use and automated manner. In particular, reel-to-reel process technologies may be used for manufacturing the conductor paths on the film substrate and for mounting the unpackaged chips (automated pick & place from the wafer composite). In a way, this intermediate step is the compromise between high-resolution lithography processes in clean laboratories (not necessarily a clean room of the wafer factories) and the rather simple process environments in a conventional printed circuit board production.

The processing of thin semiconductor chips (e.g. semiconductor components) in a printed circuit board factory poses a great challenge since unpackaged thin chips are very prone to breakage. On the other hand, the chip-film module (e.g. the film interposer) provides good protection for the semiconductor chip (e.g. the IC component), thus, quick and robustly implemented processes and machines may be used in the PCB fabrication.

The combination of the wiring structures (layout) on the chip-film module (e.g. the interposer) and on the printed circuit board planes enables new security features for electronics needing protection (e.g. crypto server, coding methods, copy protection, proof of originality). See also explanations with respect to FIG. 16.

The method enables higher integration densities in the system architecture because it enables shorter connection paths between several semiconductor chips (e.g. IC components), in particular in three-dimensionally stacked chip-film modules.

For the object of a three-dimensional integration/high integration density, the method uses simpler, less expensive, and readily available process technologies than a wafer-based integration technology based on wafer-factory infrastructures and their expensive process technologies.

Even though some aspects have been described within the context of a device, it is understood that said aspects also represent a description of the corresponding method, so that a block or a structural component of a device is also to be understood as a corresponding method step or as a feature of a method step. By analogy therewith, aspects that have been described within the context of or as a method step also represent a description of a corresponding block or detail or feature of a corresponding device. Some or all of the method steps may be performed while using a hardware device, such as a microprocessor, a programmable computer, or an electronic circuit. In some embodiments, some or several of the most important method steps may be performed by such a device.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Method for manufacturing a microelectronic arrangement, comprising:
   providing a chip-film module with a semiconductor chip and a film substrate having arranged thereon the semiconductor chip, wherein the chip-film module comprises at least one coupling element spaced apart from the semiconductor chip and electrically coupled to at least one terminal of the semiconductor chip, and
   fully embedding the chip-film module into a printed circuit board, wherein, in embedding the chip-film module into the printed circuit board, the at least one coupling element of the chip-film module is coupled vertically to at least one coupling counter element of the printed circuit board,
   wherein the film substrate comprises a film thickness of 10 to 200 μm,
   wherein an area of the film substrate is greater than a chip area of the semiconductor chip,
   wherein at least one coupling element of the at least one coupling element of the chip-film module is
      an optical coupling element, wherein at least one coupling counter element of the at least one coupling counter element of the printed circuit board is an optical coupling counter element,
      or an inductive coupling element, wherein at least one coupling counter element of the at least one coupling counter element of the printed circuit board is an inductive coupling counter element,
      or a capacitive coupling element, wherein at least one coupling counter element of the at least one coupling counter element of the printed circuit board is a capacitive coupling counter element.

2. Method according to claim 1,
   wherein at least one coupling element of the at least one coupling element of the chip-film module is an electric terminal,
   wherein at least one coupling counter element of the at least coupling counter element of the printed circuit board is a through via.

3. Method according to claim 2,
   wherein a terminal area of the terminal of the chip-film module is larger than a terminal area of the terminal of the semiconductor chip,
   and/or wherein distances between terminals of the chip-film module are larger than distances between terminals of the semiconductor chip.

4. Method according to claim 1,
   wherein the semiconductor chip is embedded into the chip-film module.

5. Method according to claim 1,
   wherein the at least one coupling element is arranged on or in the film substrate and is connected to the at least one terminal of the semiconductor chip via at least one conductor path formed on or in the film substrate.

6. Method according to claim 1,
   wherein the semiconductor chip is arranged on the film substrate such that the at least one terminal of the semiconductor chip faces away from the film substrate,
   wherein the at least one coupling element is arranged in or on an embedding layer of the chip-film module in which the semiconductor chip is embedded,
   wherein the at least one coupling element is connected to the at least one terminal of the semiconductor chip via a vertical electric connection.

7. Method according to claim 1,
   wherein the film substrate comprises at least two terminal elements connected to at least two terminals of the semiconductor chip via at least two conductor paths formed in or on the film substrate,
   wherein the chip-film module comprises at least two embedding layers located above one another or in a stacked manner, embedding the semiconductor chip and/or the film substrate,
   wherein the chip-film module comprises at least two coupling elements arranged in or on different embedding layers of the at least two embedding layers,
   wherein the at least two coupling elements are connected to the at least two terminal elements of the film substrate via vertical electric connections.

8. Method according to claim 1,
   wherein the printed circuit board comprises at least two lamination planes in which the chip-film module is embedded.

9. Method according to claim 1,
wherein the semiconductor chip is connected to at least one circuit component of the printed circuit board via the at least one coupling element of the chip-film module and the at least one coupling counter element of the printed circuit board.

10. Method according to claim 1,
wherein providing the chip-film module comprises:
providing the semiconductor chip,
providing the film substrate,
connecting the semiconductor chip to the film substrate.

11. Method according to claim 10,
wherein providing the chip-film module further comprises:
embedding the semiconductor chip into an embedding layer.

12. Method according to claim 1,
wherein embedding the chip-film module into the printed circuit board comprises:
providing at least one lamination plane of the printed circuit board,
arranging the chip-film module on the at least one lamination plane of the printed circuit board or within the at least one lamination plane of the printed circuit board,
providing at least one further lamination plane of the printed circuit board on and/or under the at least one lamination plane of the printed circuit board so that the chip-film module is embedded into the printed circuit board.

13. Method according to claim 1,
wherein the film substrate comprises at least two coupling elements spaced apart from the semiconductor chip and connected to at least two terminals of the semiconductor chip via two conductor paths formed in or on the film substrate,
wherein the at least two coupling elements are electric terminals,
wherein conductor paths of the printed circuit board are connected to the terminals of the film substrate via at least two through vias as counter coupling elements.

14. Method according to claim 13,
wherein the semiconductor chip is embedded into the chip-film module in an embedding layer arranged on the film substrate.

15. Method according to claim 14,
wherein the at least two through vias extend vertically through the film substrate or through the embedding layer to the at least two terminals of the film substrate.

16. Method according to claim 14,
wherein, starting from a first plane of the printed circuit board, a first through via of the at least two through vias extends vertically through the film substrate to a first terminal of the at least two terminals of the film substrate,
and/or wherein, starting from a second plane of the printed circuit board, a second through via of the at least two through vias extends vertically through the embedding layer of the chip-film module to a second terminal of the at least two terminals of the film substrate.

17. Method according to claim 1,
wherein the at least one coupling element is arranged on or in the film substrate and is connected to the at least one terminal of the semiconductor chip via at least one conductor path formed on or in the film substrate,
wherein at least one coupling element of the at least one coupling element of the film substrate is an optical coupling element, wherein at least one coupling counter element of the at least one coupling counter element of the printed circuit board is an optical coupling counter element, wherein the optical coupling element and the optical counter coupling element are optically coupled to each other in a vertical direction.

18. Method according to claim 17,
wherein at least one further coupling element of the at least one coupling element is arranged on or in the film substrate and is connected to at least one further terminal of the semiconductor chip via at least one further conductor path formed on or in the film substrate,
wherein the at least one further coupling element is an inductive or a capacitive coupling element, wherein at least one further coupling counter element of the at least one coupling counter element of the printed circuit board is an inductive or a capacitive coupling counter element, wherein the inductive or capacitive coupling element and the inductive or capacitive coupling counter element are inductively or capacitively coupled to each other in the vertical direction.

19. Method according to claim 1,
wherein the chip-film module comprises at least two coupling elements,
wherein the semiconductor chip comprises at least two terminals,
wherein the semiconductor chip is arranged on the film substrate such that the at least two terminals of the semiconductor chip face away from the film substrate,
wherein the at least two coupling elements are arranged in or on an embedding layer of the chip-film module in which the semiconductor chip is embedded,
wherein the at least two coupling elements are connected to the at least two terminals of the semiconductor chip via vertical electric connections,
wherein the at least two coupling elements are electric terminals,
wherein conductor paths of the printed circuit board are connected to the at least two terminals of the chip-film module via at least two through vias as counter coupling elements.

20. Method according to claim 19,
wherein the film substrate is a thermally conductive film substrate,
wherein the printed circuit board comprises thermal through vias neighboring the thermally conductive film substrate, configured to conduct thermal energy from the thermally conductive film substrate to a surrounding area of the printed circuit board.

21. Method according to claim 1,
wherein the film substrate comprises two terminal elements connected to at least two terminals of the semiconductor chip via at least two conductor paths formed in or on the film substrate,
wherein the chip-film module comprises two embedding layers located above one another or in a stacked manner, embedding the semiconductor chip and/or the film substrate,
wherein the chip-film module comprises at least two coupling elements arranged in or on different embedding layers of the at least two embedding layers,
wherein the at least two coupling elements are connected to the at least two terminal elements of the film substrate via vertical electric connections,
wherein the at least two coupling elements are electric terminals, wherein conductor paths of the printed circuit board are connected to the at least two terminals of the chip-film module via at least two through vias as counter coupling elements, wherein, starting from a first plane of the printed circuit board, a first through via of the at least two through vias extends vertically to a first terminal of the at least two terminals of the chip-film module, wherein, starting from a second plane of the printed circuit board, a second through via of the at least two through vias extends vertically to a second of the at least two terminals of the film substrate.

22. Method according to claim 1, wherein the method comprises providing a further chip-film module with a further semiconductor chip and a further film substrate having arranged thereon the further semiconductor chip, wherein the further chip-film module comprises at least one coupling element spaced apart from the further semiconductor chip and coupled to at least one terminal of the further semiconductor chip, and wherein the method comprises embedding the further chip-film module into the printed circuit board, wherein, in embedding the further chip-film module into the printed circuit board, the at least one coupling element of the further chip-film module is vertically coupled to the at least one further coupling counter element of the printed circuit board, wherein the chip-film module and the further chip-film module are stacked in a vertical direction of the printed circuit board.

23. Method according to claim 1, wherein the printed circuit board comprises at least two conductor path planes, wherein the chip-film module is arranged between the at least two conductor path planes, wherein, in embedding the chip-film module into the printed circuit board, a vertical through via is formed through the chip-film module for connecting conductor paths of the at least two conductor path planes.

\* \* \* \* \*